(12) United States Patent
Liao et al.

(10) Patent No.: US 12,120,898 B2
(45) Date of Patent: Oct. 15, 2024

(54) PHOTOSENSITIVE DEVICE

(71) Applicant: AUO Corporation, Hsinchu (TW)

(72) Inventors: Yi-Huan Liao, Hsinchu (TW); Chun Chang, Hsinchu (TW); Hsin-Hsuan Lee, Hsinchu (TW)

(73) Assignee: AUO Corporation, Hsinchu (TW)

( * ) Notice: Subject to any disclaimer, the term of this patent is extended or adjusted under 35 U.S.C. 154(b) by 0 days.

(21) Appl. No.: 18/496,939

(22) Filed: Oct. 30, 2023

(65) Prior Publication Data

US 2024/0065012 A1   Feb. 22, 2024

Related U.S. Application Data

(62) Division of application No. 17/351,272, filed on Jun. 18, 2021, now Pat. No. 11,832,462.

(30) Foreign Application Priority Data

Nov. 10, 2020 (TW) .................................. 109139187

(51) Int. Cl.
*H10K 39/32* (2023.01)
*H10K 71/50* (2023.01)
*H10K 71/80* (2023.01)

(52) U.S. Cl.
CPC ............. *H10K 39/32* (2023.02); *H10K 71/50* (2023.02); *H10K 71/80* (2023.02)

(58) Field of Classification Search
CPC ......... H10K 39/32; H10K 71/50; H10K 71/80
See application file for complete search history.

(56) References Cited

U.S. PATENT DOCUMENTS

| | | | |
|---|---|---|---|
| 2008/0035835 A1* | 2/2008 | Komatsu | H10K 39/32 250/208.1 |
| 2015/0060773 A1* | 3/2015 | Liang | H10K 30/40 257/40 |

* cited by examiner

*Primary Examiner* — Robert G Bachner
*Assistant Examiner* — Molly K Reida
(74) *Attorney, Agent, or Firm* — JCIPRNET

(57) ABSTRACT

A photosensitive device including a microlens substrate, a photosensitive element substrate, and an optical glue is provided. The microlens substrate includes a first substrate and microlenses. The first substrate has a first side and a second side opposite to the first side. The microlenses are located on the first side of the first substrate. The photosensitive element substrate includes a second substrate, active components, first electrodes, a second electrode, and an organic photosensitive material layer. The second substrate has a third side and a fourth side opposite to the third side. The second side of the first substrate faces the third side of the second substrate. The active components are located on the fourth side of the second substrate. The first electrodes are respectively electrically connected to the active components. The organic photosensitive material layer is located between the first electrodes and the second electrode.

11 Claims, 19 Drawing Sheets

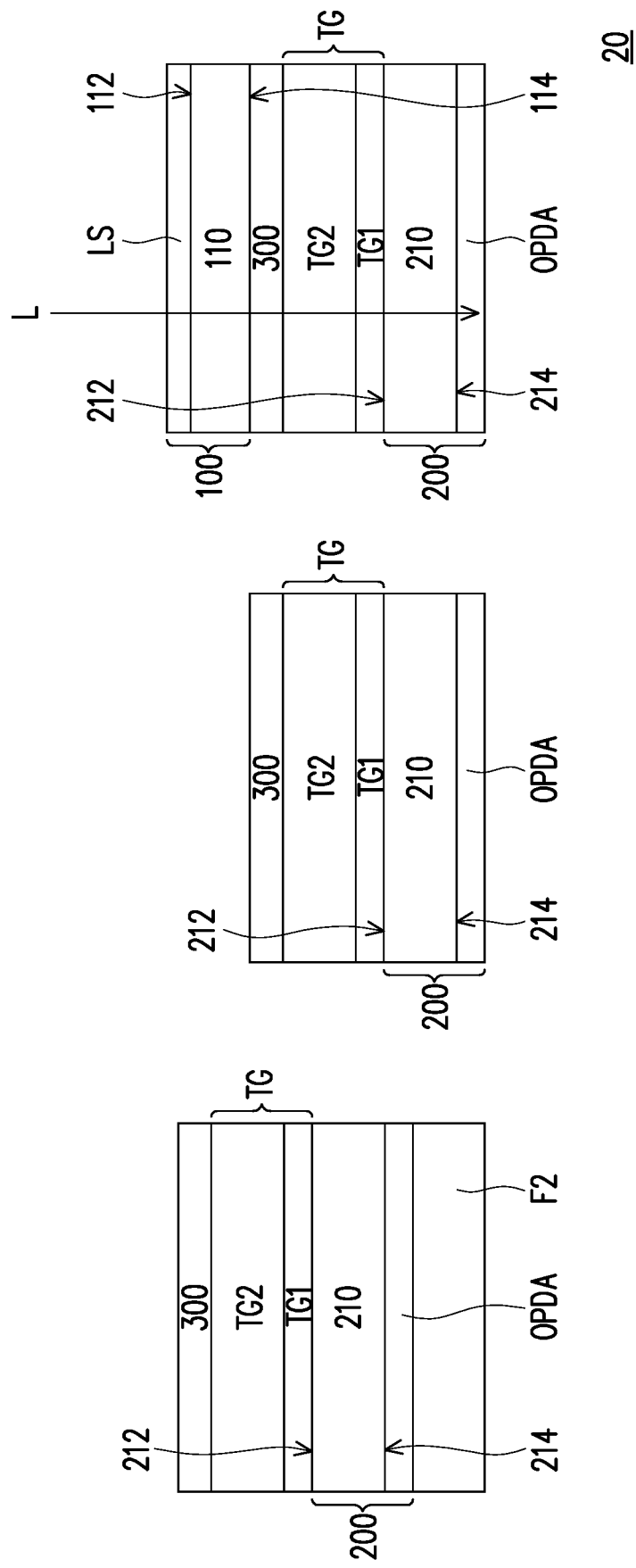

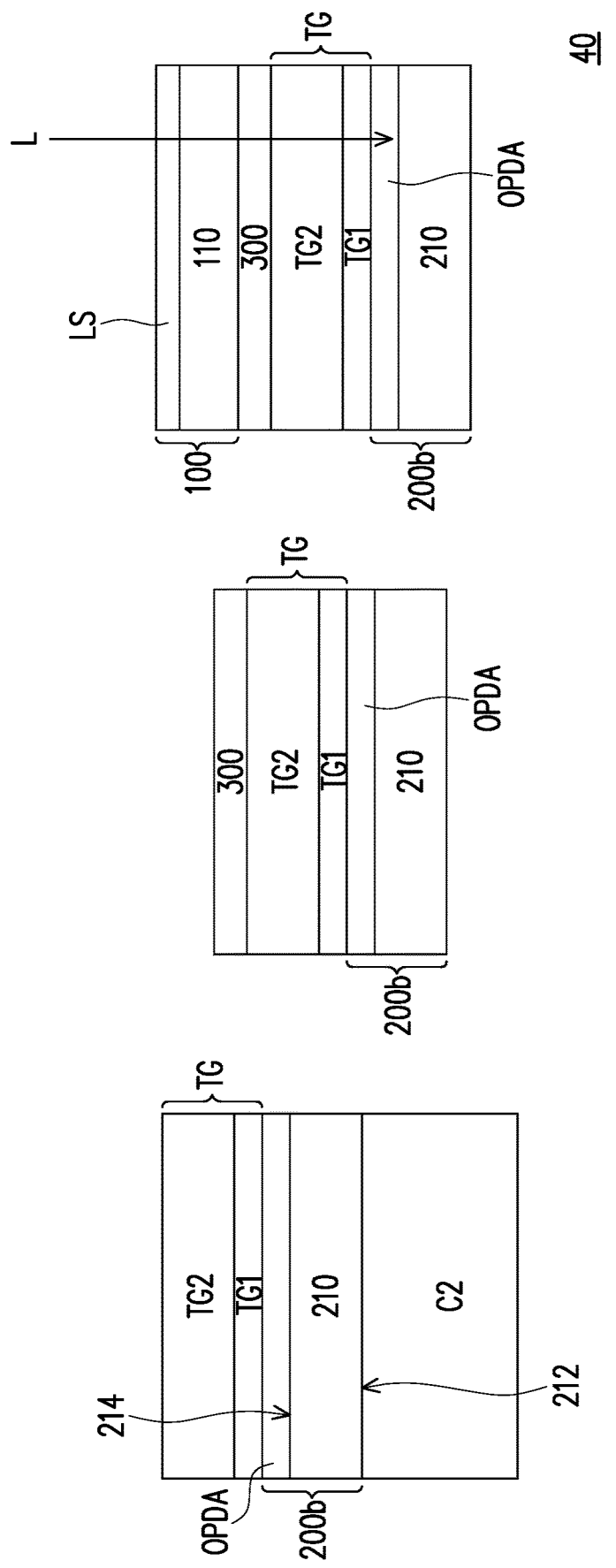

PHOTOSENSITIVE DEVICE

CROSS REFERENCE TO RELATED APPLICATION

This application is a divisional application of and claims the priority benefit of U.S. application Ser. No. 17/351,272, filed on Jun. 18, 2021, which claims the priority benefit of Taiwan application serial no. 109139187, filed on Nov. 10, 2020. The entirety of each of the above-mentioned patent applications is hereby incorporated by reference herein and made a part of this specification.

BACKGROUND

Technical Field

The disclosure relates to a photosensitive device, and particularly relates to a photosensitive device including a microlens substrate and a photosensitive element substrate.

Description of Related Art

With the development of technology, personal electronic products are equipped with various sorts of functions. For example, besides making phone calls, mobile phones on the current market may also be used for taking pictures, recording videos, taking notes, and surfing the Internet, among many others. And the existing personal electronic products are often equipped with a photosensitive device. The photosensitive device detects light of the environment around the electronic product. In addition to helping users take photos and videos with better quality, some photosensitive devices are also used to detect the ridge and furrow of a user's finger surface to equip the electronic products with the function of fingerprint recognition. It is an eager aim for the manufacturers to improve the manufacturing yield of photosensitive elements.

SUMMARY

The disclosure is directed to a photosensitive device, which has a higher manufacturing yield.

At least one embodiment of the disclosure provides a photosensitive device including a microlens substrate, a photosensitive element substrate and an optical glue. The optical glue is located between the microlens substrate and the photosensitive element substrate. The microlens substrate includes a first substrate and a plurality of microlenses. The first substrate has a first side and a second side opposite to the first side. The microlenses are located on the first side of the first substrate. The photosensitive element substrate includes a second substrate, a plurality of active components, a plurality of first electrodes, a second electrode, and an organic photosensitive material layer. The second substrate has a third side and a fourth side opposite to the third side. The second side of the first substrate faces the third side of the second substrate. The active components are located on the fourth side of the second substrate. The first electrodes are respectively electrically connected to the active components. The second electrode is overlapped with the first electrodes. The organic photosensitive material layer is located between the first electrodes and the second electrode. The first electrodes are closer to the fourth side of the second substrate compared with the second electrode.

At least one embodiment of the disclosure provides a photosensitive device including a microlens substrate, a photosensitive element substrate and an optical glue. The optical glue is located between the microlens substrate and the photosensitive element substrate. The microlens substrate includes a first substrate and a plurality of microlenses. The first substrate has a first side and a second side opposite to the first side. The microlenses are located on the first side of the first substrate. The photosensitive element substrate includes a second substrate, a plurality of active components, a plurality of first electrodes, a second electrode and an organic photosensitive material layer. The second substrate has a third side and a fourth side opposite to the third side. The second side of the first substrate faces the fourth side of the second substrate. The active components are located on the fourth side of the second substrate. The first electrodes are respectively electrically connected to the active components. The second electrode is overlapped with the first electrodes. The organic photosensitive material layer is located between the first electrodes and the second electrode. The first electrodes are closer to the fourth side of the second substrate compared with the second electrode.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 2A to FIG. 6A are schematic cross-sectional views of a method for manufacturing a photosensitive element substrate according to an embodiment of the disclosure.

FIG. 2B to FIG. 6B are schematic top views of the method for manufacturing the photosensitive element substrate according to an embodiment of the disclosure.

FIG. 8A to FIG. 8C are schematic cross-sectional views of a method for manufacturing a photosensitive device according to an embodiment of the disclosure.

FIG. 10A to FIG. 13A are schematic cross-sectional views of a method for manufacturing a photosensitive element substrate according to an embodiment of the disclosure.

FIG. 10B to FIG. 13B are schematic top views of the method for manufacturing the photosensitive element substrate according to an embodiment of the disclosure.

FIG. 15A to 15C are schematic cross-sectional views of a method for manufacturing a photosensitive device according to an embodiment of the disclosure.

DESCRIPTION OF THE EMBODIMENTS

Figure 1:
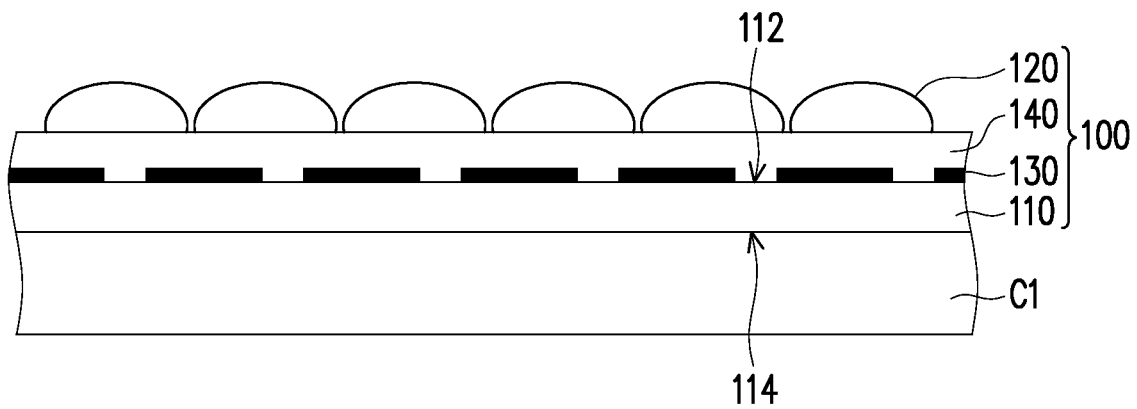
FIG. 1 is a schematic cross-sectional view of a microlens substrate according to an embodiment of the disclosure.

FIG. 1 is a schematic cross-sectional view of a microlens substrate according to an embodiment of the disclosure.

Referring to FIG. 1, a microlens substrate 100 is formed on a first carrier C1. A material of the first carrier C1 is, for example, glass, quartz, metal or other materials suitable for supporting the microlens substrate 100.

The microlens substrate 100 includes a first substrate 110 and a plurality of microlenses 120. In the embodiment, the microlens substrate 100 further includes a light shielding structure 130 and a planarization layer 140.

The first substrate 110 has a first side 112 and a second side 114 opposite to the first side 112. The second side 114 of the first substrate 110 faces the first carrier C1 and is in contact with the first carrier C1. In some embodiments, the first substrate 110 is made of a flexible material, for example, including polyamide (PA), polyimide (PI), poly(methyl methacrylate) (PMMA), polyethylene naphthalate (PEN), polyethylene terephthalate (PET), fiber reinforced plastics (FRP), polyetheretherketone (PEEK), epoxy resin or other suitable materials or a combination of at least two of the above materials, but the disclosure is not limited thereto.

The microlenses 120, the light shielding structure 130, and the planarization layer 140 are located on the first side 112 of the first substrate 110. In this embodiment, the light shielding structure 130, the planarization layer 140, and the microlenses 120 are sequentially formed on the first side 112 of the first substrate 110. The microlenses 120 and the light shielding structure 130 are respectively located on two opposite sides of the planarization layer 140. In the embodiment, the light shielding structure 130 is closer to the first side 112 of the first substrate 110 compared with the microlenses 120, but the disclosure is not limited thereto. In other embodiments, the microlenses 120 are closer to the first side 112 of the first substrate 110 compared with the light shielding structure 130.

In some embodiments, the microlens 120 may be used to converge and/or guide light, so as to improve the performance of the photosensitive device. The microlens 120 may be a lens structure with a center thickness thicker than an edge thickness, such as a symmetric biconvex lens, an asymmetric biconvex lens, a plano-convex lens, or a concavo-convex lens. In some embodiments, a material of the microlens 120 includes glass, polymer (for example, polycarbonate), silicon or semiconductor or a combination of the above materials.

In some embodiments, the light shielding structure 130 is a black matrix. In some embodiments, a material of the light shielding structure 130 includes black resin, chromium or chromium oxide, or other opaque materials. In some embodiments, a method of forming the light shielding structure 130 includes a photolithography process.

FIG. 2A to FIG. 6A are schematic cross-sectional views of a method for manufacturing a photosensitive element substrate according to an embodiment of the disclosure. FIG. 2B to FIG. 6B are schematic top views of the method for manufacturing the photosensitive element substrate according to an embodiment of the disclosure. FIG. 2A to FIG. 6A respectively correspond to positions of lines a-a' in FIG. 2B to FIG. 6B.

Figure 2A:
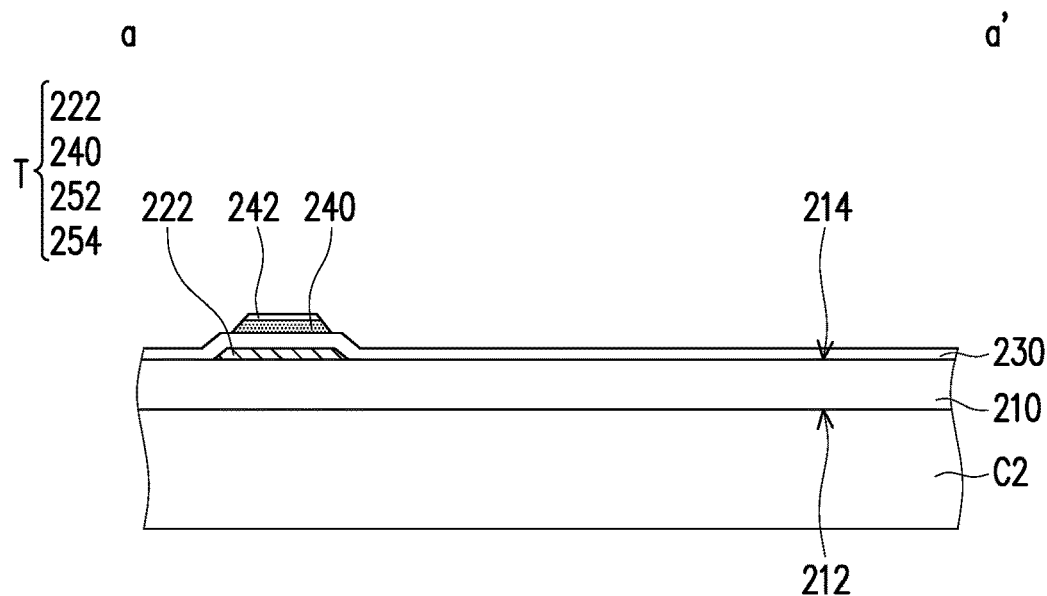
Figure 2B:
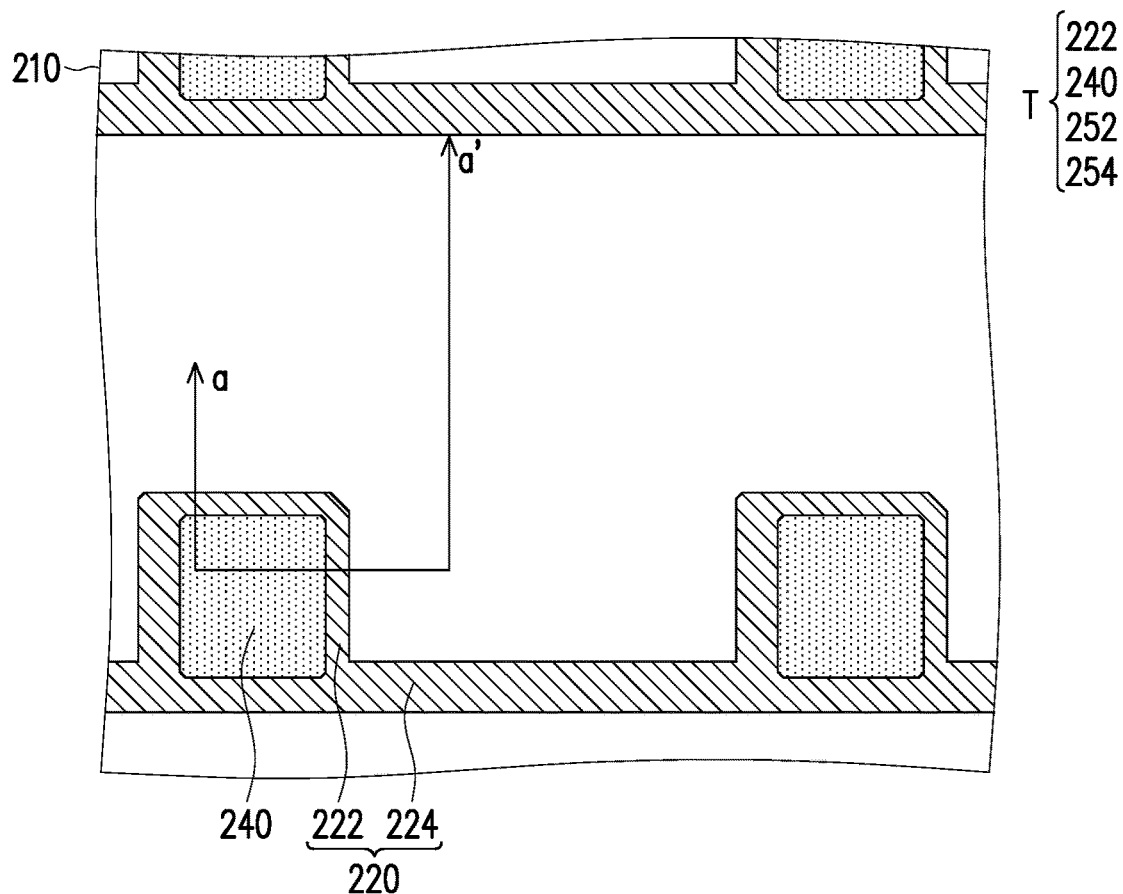

Referring to FIG. 2A and FIG. 2B, a second substrate 210 is formed on a second carrier C2. A material of the second carrier C2 is, for example, glass, quartz, metal or other materials suitable for carrying the photosensitive element substrate.

The second substrate 210 has a third side 212 and a fourth side 214 opposite to the third side 212. The third side 212 of the second substrate 210 faces the second carrier C2 and is in contact with the second carrier C2. In some embodiments, the second substrate 210 is made of a flexible material, for example, including polyamide (PA), polyimide (PI), poly(methyl methacrylate) (PMMA), polyethylene naphthalate (PEN), polyethylene terephthalate (PET), fiber reinforced plastics (FRP), polyetheretherketone (PEEK), epoxy resin or other suitable materials or a combination of at least two of the above materials, but the disclosure is not limited thereto.

A first conductive layer 220, a gate insulating layer 230, and a semiconductor layer 240 are formed on the fourth side 214 of the second substrate 210. The first conductive layer 220 includes a gate 222 and a scan line 224 connected to the gate 222. The gate 222 and the scan line 224 are located on the fourth side 214 of the second substrate 210. In some embodiments, a method of forming the first conductive layer 220 includes forming a conductive material on the fourth side 214 of the second substrate 210, and then patterning the conductive material to form the gate 222 and the scan line 224. A material of the first conductive layer 220 is, for example, a metal, a nitride, an oxide, an oxynitride, or other suitable materials or a stacked layer of a metal material and other conductive materials.

The gate insulating layer 230 is formed on the first conductive layer 220. A material of the gate insulating layer 230 is, for example, nitride, oxide, oxynitride, an organic material or other suitable insulating materials.

The semiconductor layer 240 is formed on the gate insulating layer 230. The semiconductor layer 240 is overlapped with the gate 222, and the gate insulating layer 230 is sandwiched between the semiconductor layer 240 and the gate 222. The semiconductor layer 240 includes amorphous silicon, polycrystal silicon, microcrystal silicon, single crystal silicon, an organic semiconductor material, an oxide semiconductor material (for example: indium zinc oxide, indium gallium zinc oxide or other suitable materials, or a combination thereof) or other suitable materials or a combination of the above materials. In some embodiments, an ohmic contact layer 242 is formed on a surface of the semiconductor layer 240 (not shown in FIG. 2B to FIG. 6B), and a material of the ohmic contact layer 242 is, for example, a doped semiconductor material.

Figure 3A:
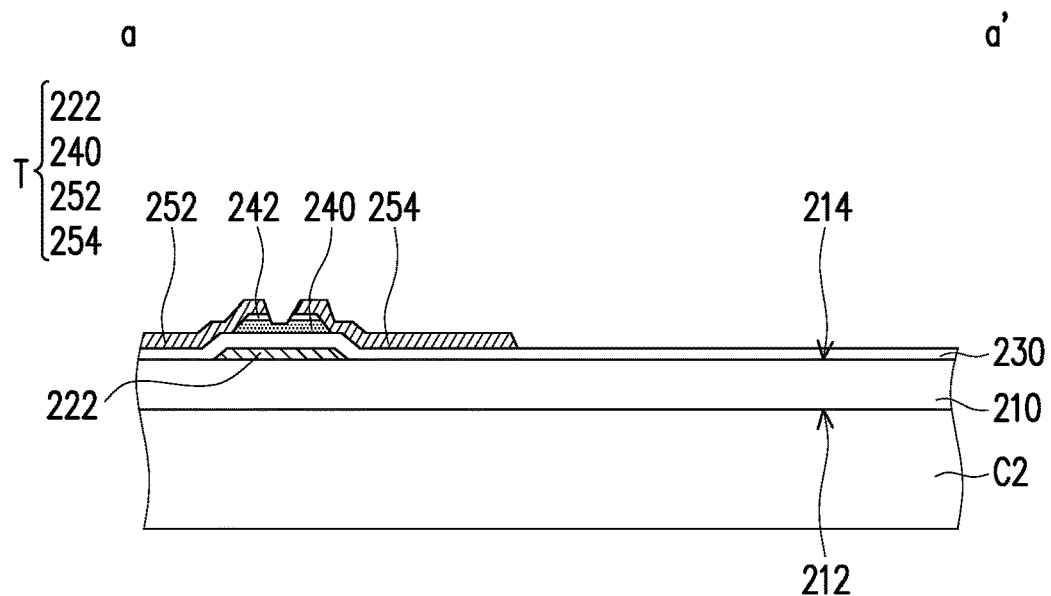
Figure 3B:
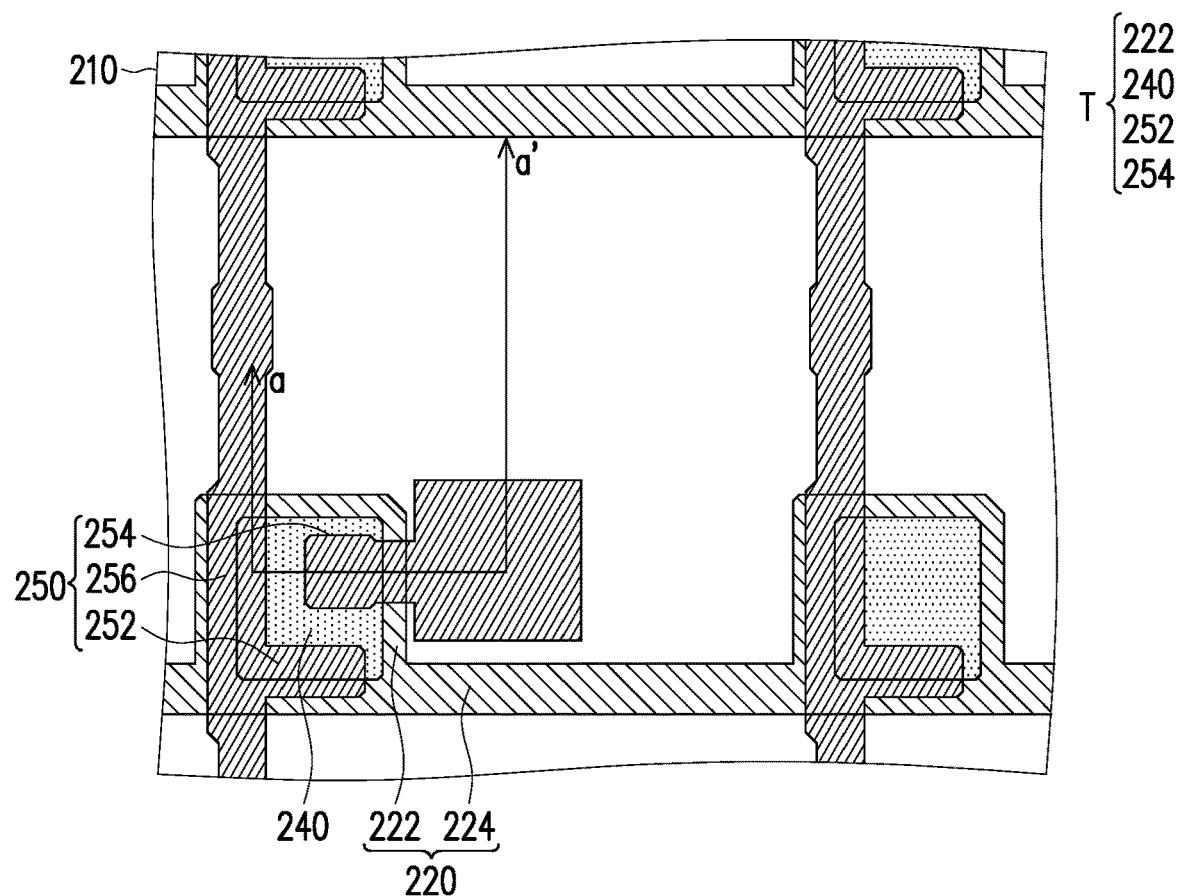

Referring to FIG. 3A and FIG. 3B, a second conductive layer 250 is formed on the semiconductor layer 240 and the gate insulating layer 230. The second conductive layer 250 includes a source 252, a drain 254, and a data line 256, where the source 252 and the drain 254 are electrically connected to the semiconductor layer 240, and the data line 256 is connected to the source 252. In some embodiments, a method of forming the second conductive layer 250 includes forming a conductive material on the semiconductor layer 240 and the gate insulating layer 230, and then patterning the conductive material to form the source 252, the drain 254 and the data line 256, where when the aforementioned conductive material is patterned, a part of the ohmic contact layer 242 between the source 252 and the drain 254 may be removed. A material of the second conductive layer 250 is, for example, a metal, a nitride, an oxide, an oxynitride, or other suitable materials, or a stacked layer of a metal material and other conductive materials.

By now, a plurality of active components T are substantially completed. The active component T is located on the fourth side 214 of the second substrate 210 and includes the gate 222, the semiconductor layer 240, the source 252 and the drain 254. In the embodiment, the active component T is a bottom gate type thin-film transistor, but the disclosure is not limited thereto. In other embodiments, the active component T may also be a top gate type or other types of thin-film transistor.

Figure 4A:
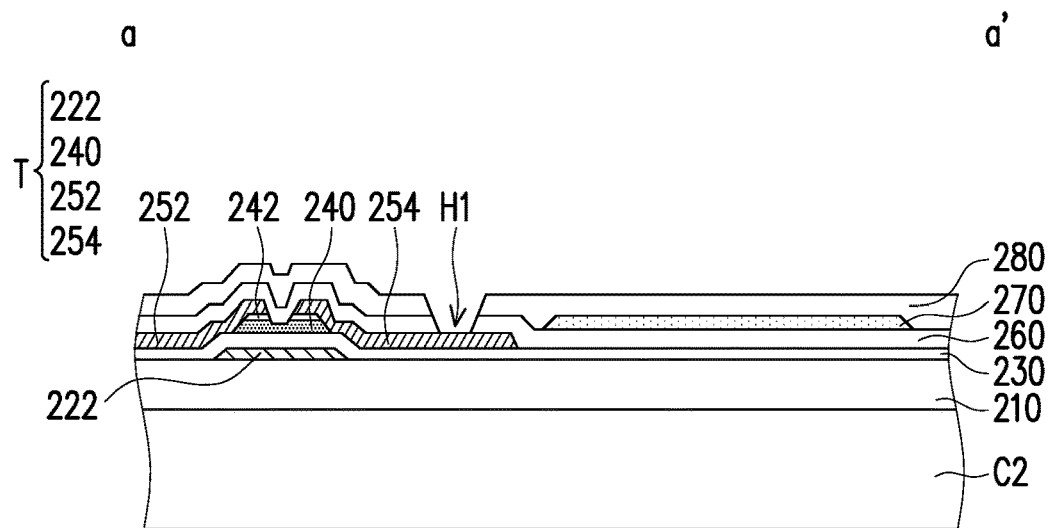
Figure 4B:
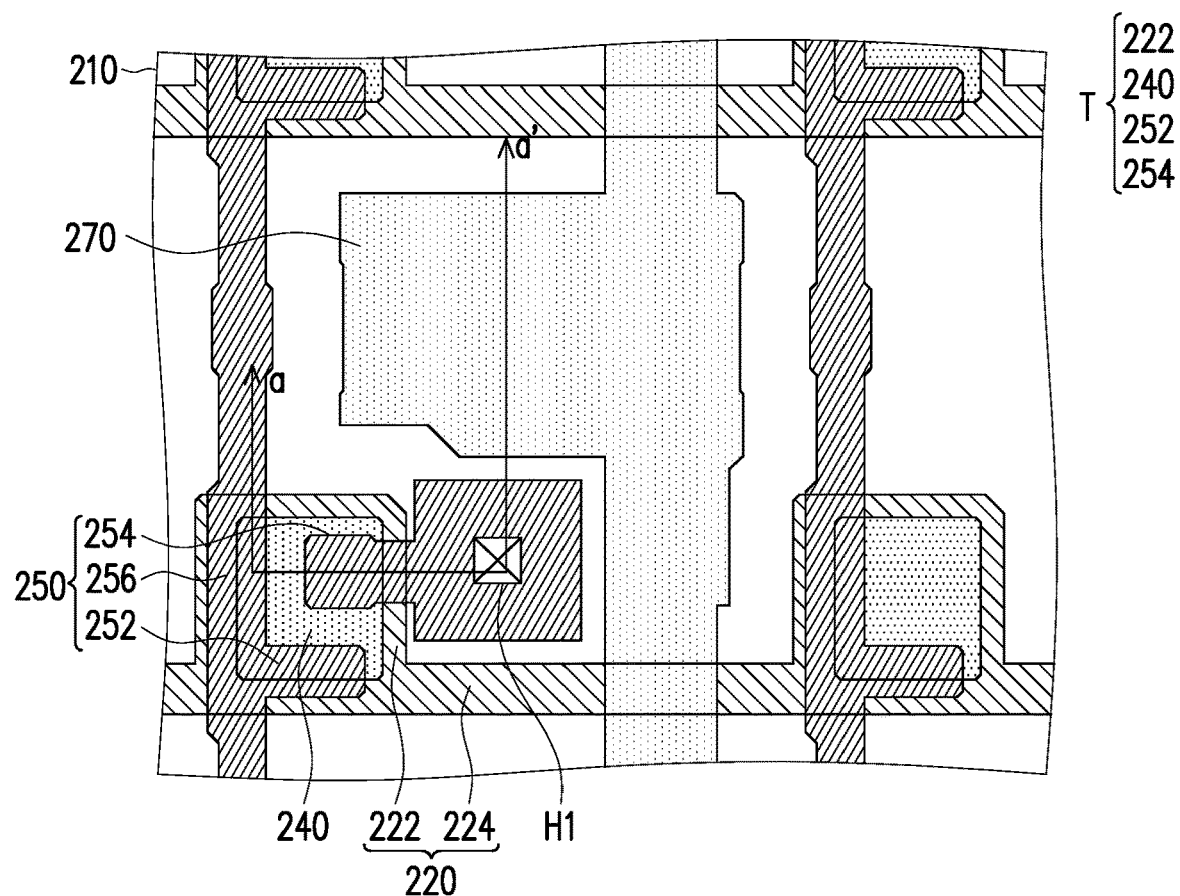

Referring to FIG. 4A and FIG. 4B, a first insulating layer 260 is formed on the active component T and the gate insulating layer 230. A common electrode 270 is formed on the first insulating layer 260. In the embodiment, the common electrode 270 is made of a transparent conductive material. For example, the common electrode 270 is a metal oxide (for example, indium tin oxide or indium zinc oxide). A second insulating layer 280 is formed on the active component T, the common electrode 270 and the first insulating layer 260. A through hole H1 penetrating through the first insulating layer 260 and the second insulating layer 280 is formed, and the through hole H1 is overlapped with the drain electrode 254 of the active component T.

Figure 5A:
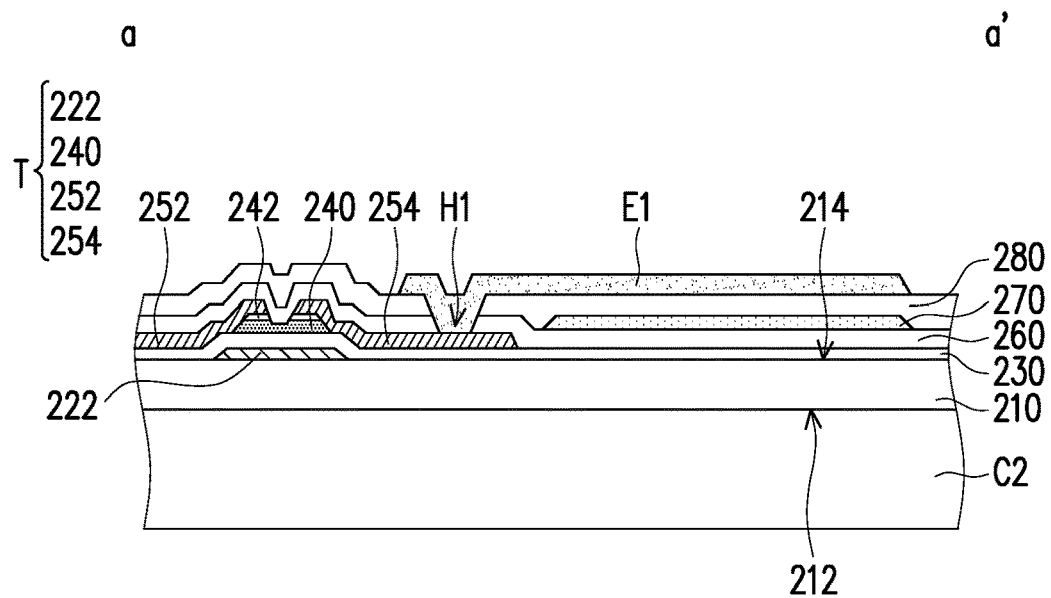
Figure 5B:
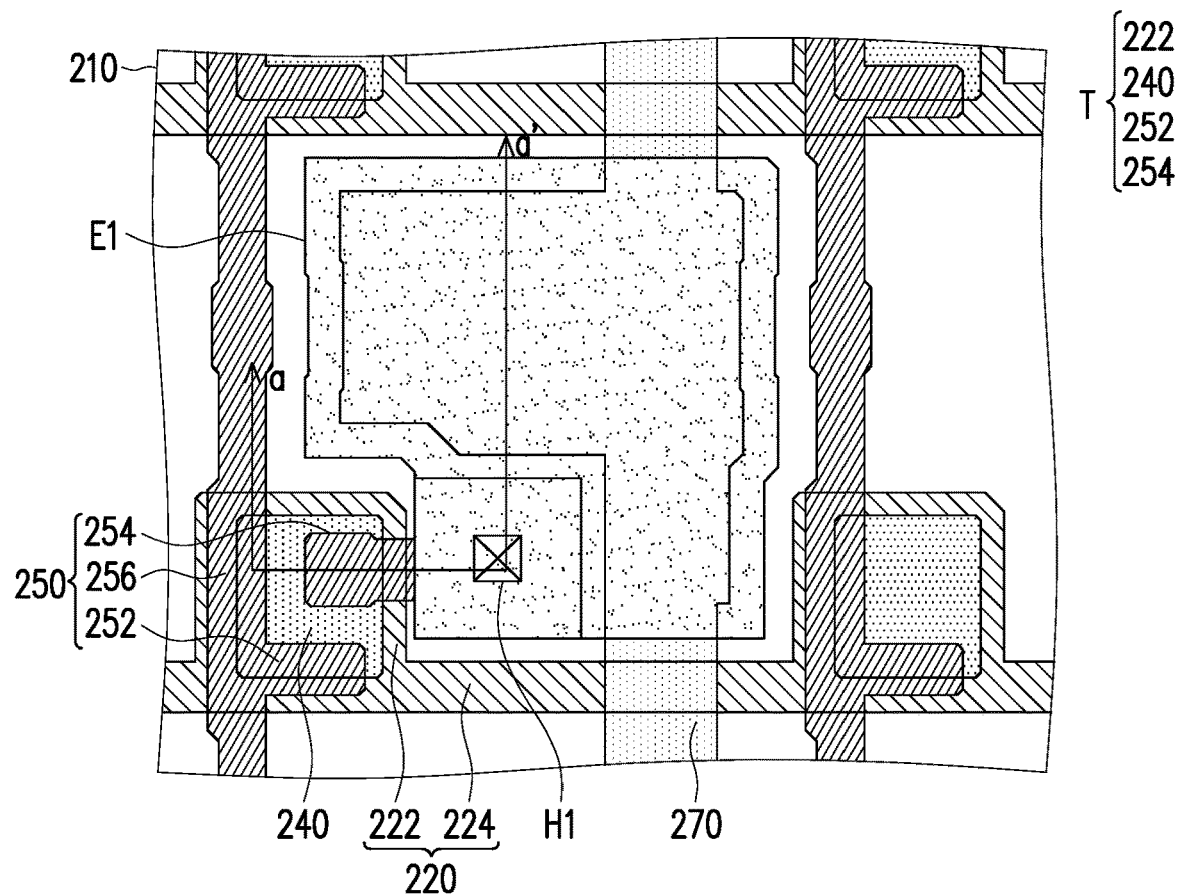

Referring to FIG. 5A and FIG. 5B, a plurality of first electrodes E1 are formed on the second insulating layer 280. The first electrodes E1 are respectively electrically connected to the active components T. In the embodiment, the first electrode E1 is connected to the drain 254 of the active component T through the through hole H1. Each drain 254 is electrically connected to the corresponding first electrode E1.

The common electrode 270 is overlapped with the first electrode E1, and the second insulating layer 280 is located between the common electrode 270 and the first electrode E1. The common electrode 270 is closer to the second substrate 210 compared with the first electrode E1. In some embodiments, each common electrode 270 is overlapped with a plurality of first electrodes E1 (the common electrode 270 extends to a region not shown in FIG. 5B and is overlapped with other first electrodes that are not shown).

Figure 6A:
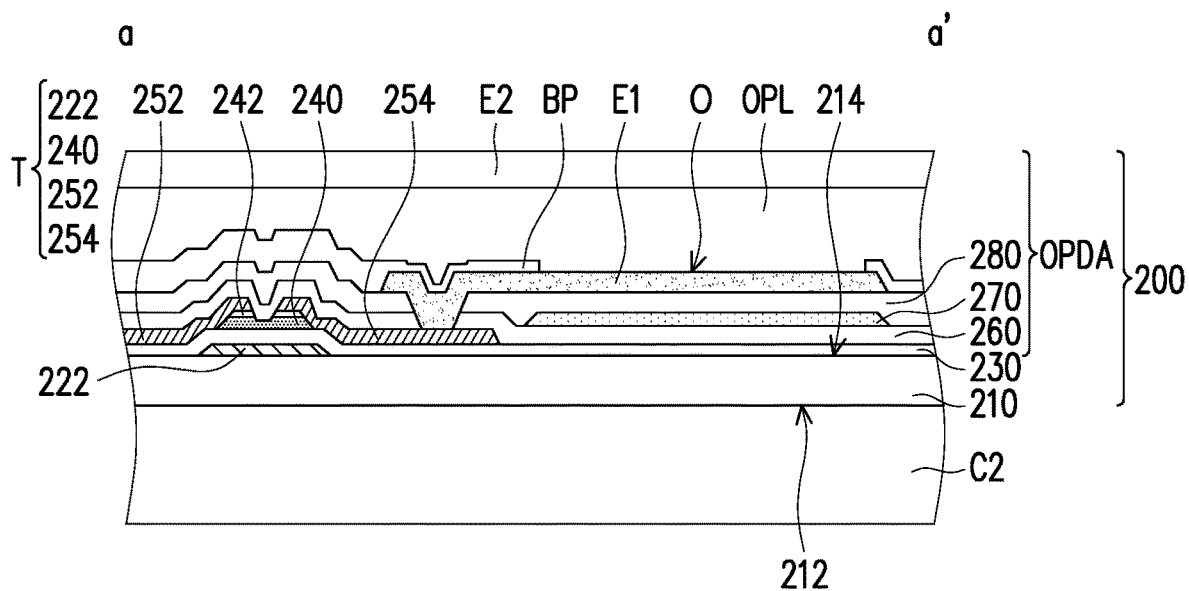
Figure 6B:
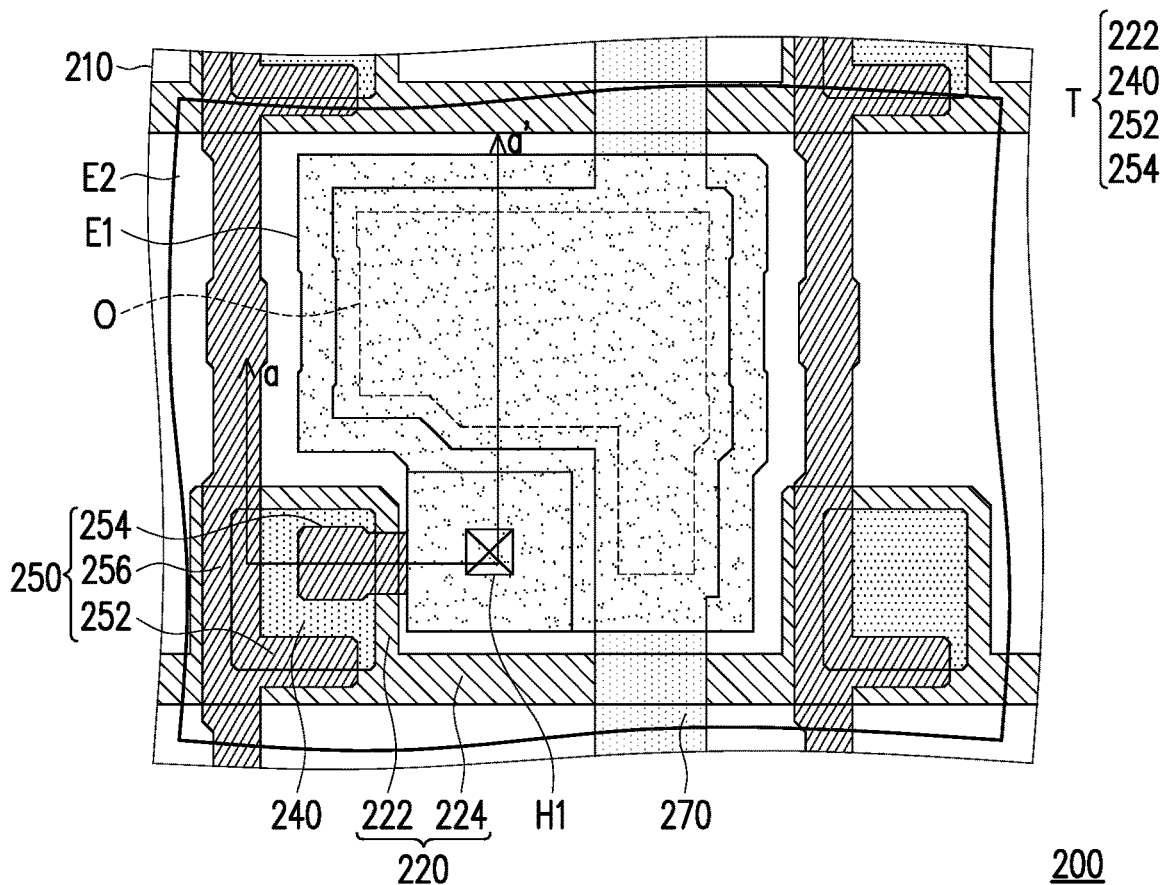

Referring to FIG. 6A and FIG. 6B, a buffer layer BP is formed on the first electrodes E1. The buffer layer BP has a plurality of openings O. The openings O are respectively overlapped with the first electrodes E1. In the embodiment, each opening O is overlapped with one first electrode E1. A material of the buffer layer BP includes an organic material, an oxide, a nitride, an oxynitride or other insulating materials.

An organic photosensitive material layer OPL is formed on the first electrodes E1 and the buffer layer BP. In the embodiment, the organic photosensitive material layer OPL is filled in the openings O and contacts the first electrodes E1. In some embodiments, the organic photosensitive material layer OPL is entirely formed on the first electrodes E1 and the buffer layer BP. The organic photosensitive material layer OPL is overlapped with a plurality of the first electrodes E1, and the organic photosensitive material layers OPL on the adjacent first electrodes E1 are laterally connected to each other.

A second electrode E2 is formed on the organic photosensitive material layer OPL. In some embodiments, the second electrode E2 is entirely formed on the organic photosensitive material layer OPL. The second electrode E2 is overlapped with the plurality of first electrodes E1, and the second electrodes E2 on the adjacent first electrodes E1 are laterally connected to each other. The organic photosensitive material layer OPL is located between the first electrodes E1 and the second electrode E2. In some embodiments, the first electrodes E1 are closer to the fourth side 214 of the second substrate 210 compared with the second electrode E2. In some embodiments, the second electrode E2 and the common electrode 270 are electrically connected to each other in a peripheral region.

In some embodiments, the second electrode E2 includes a polymer nanoparticle material or a metal material (such as silver). In some embodiments, the first electrode E1 is made of a transparent conductive material. For example, the first electrode E1 is made of a metal oxide (for example, indium tin oxide or indium zinc oxide). In some embodiments, a transmittance of the first electrode E1 in a visible light band (400-700 nm) is greater than 90%. In some embodiments, light enters the organic photosensitive material layer OPL from one side of the first electrode E1, and generates electron hole pairs in the organic photosensitive material layer OPL.

By now, fabrication of the photosensitive element substrate 200 is substantially completed. In the embodiment, the photosensitive element substrate 200 includes the second substrate 210 and a photosensitive element array layer OPDA on the second substrate 210. The photosensitive element array layer OPDA includes a plurality of the active components T, a plurality of the first electrodes E1, the second electrode E2, and the organic photosensitive material layer OPL. In the embodiment, the photosensitive element array layer OPDA further includes the scan line 224, the gate insulating layer 230, the data line 256, the first insulating layer 260, the common electrode 270, the second insulating layer 280, and the buffer layer BP.

In the embodiment, an area of a photosensitive region of the photosensitive element substrate 200 is approximately equal to an area of the opening O. If an area encircled by the scan lines 224 and the data lines 256 is taken as a pixel area, the area of the photosensitive region approximately occupies 24%-60% of the pixel area. In some embodiments, the pixel area of the photosensitive element substrate 200 is about 50 μm×50 μm or less than 50 μm×50 μm. In some embodiments, a resolution of the photosensitive element substrate 200 is greater than or equal to 500 ppi.

FIG. 7A to FIG. 7I are schematic cross-sectional views of a method for manufacturing a photosensitive device according to an embodiment of the disclosure.

Figure 7C:
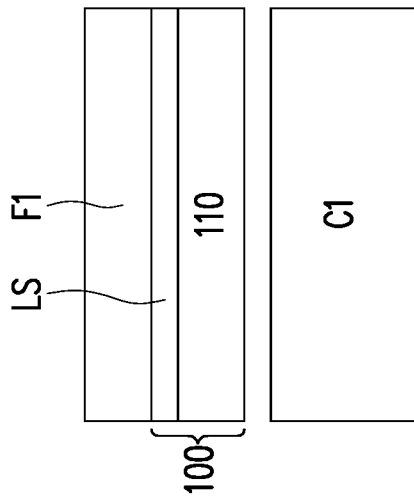
FIG. 7A to FIG. 7I are schematic cross-sectional views of a method for manufacturing a photosensitive device according to an embodiment of the disclosure.
Figure 7B:
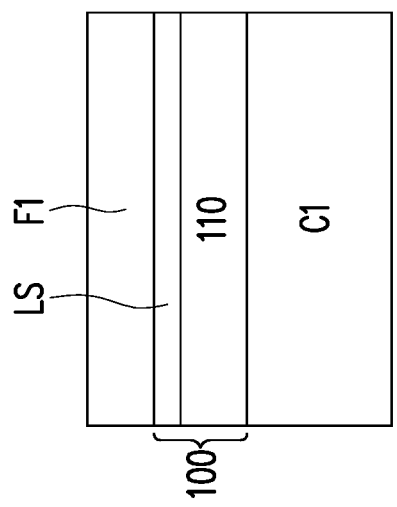
Figure 7A:
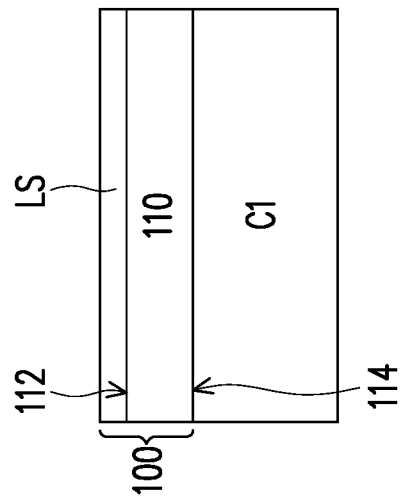

Referring to FIG. 7A, the microlens substrate 100 is formed on the first carrier C1. The microlens substrate 100 includes the first substrate 110 and an optical structure layer LS. Reference may be made to FIG. 1 and related descriptions thereof for the structure of the optical structure layer LS, and detail thereof is not repeated.

The first substrate 110 has the first side 112 and the second side 114 opposite to the first side 112. The second side 114 of the first substrate 110 faces the first carrier C1 and is in contact with the first carrier C1. The optical structure layer LS is located on the first side 112.

Referring to FIG. 7B, a protective film F1 is formed on the optical structure layer LS.

Referring to FIG. 7C, the microlens substrate 100 and the protective film F1 are lifted up from the first carrier C1.

Figure 7F:
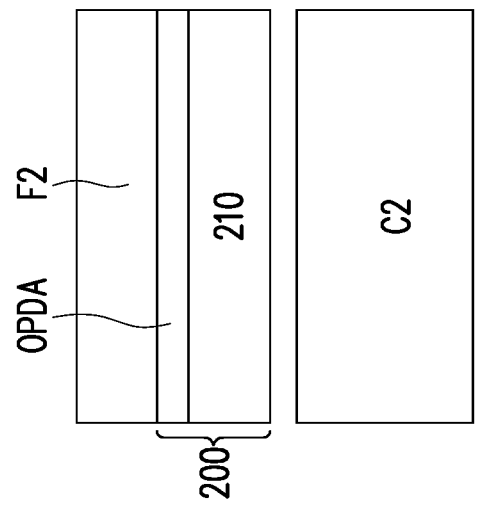
Figure 7E:
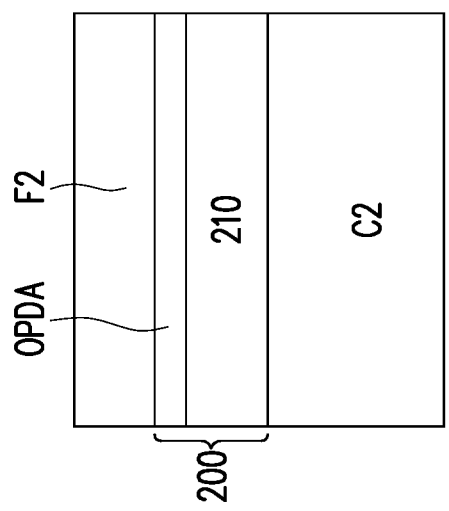
Figure 7D:
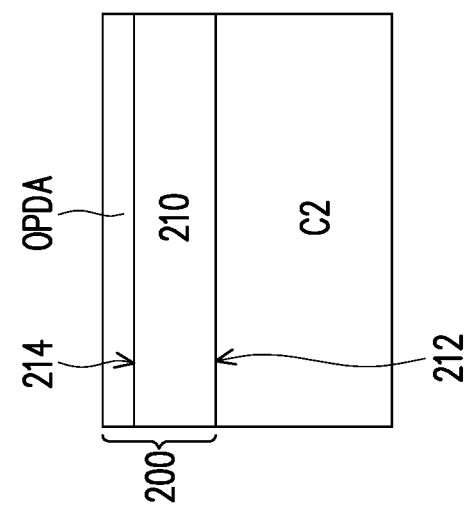

Referring to FIG. 7D, the photosensitive element substrate 200 is formed on the second carrier C2. The photosensitive element substrate 200 includes the second substrate 210 and the photosensitive element array layer OPDA. Reference may be made to FIG. 6A, FIG. 6B and related descriptions thereof for the structure of the photosensitive element array layer OPDA, and detail thereof is not repeated.

The second substrate 210 has the third side 212 and the fourth side 214 opposite to the third side 212. The third side 212 of the second substrate 210 faces the second carrier C2 and is in contact with the second carrier C2. The photosensitive element array layer OPDA is located on the fourth side 214 of the second substrate 210.

Referring to FIG. 7E, a protective film F2 is formed on the photosensitive element array layer OPDA.

Referring to FIG. 7F, the photosensitive element substrate 200 and the protective film F2 are lifted up from the second carrier C2.

Figure 7G:
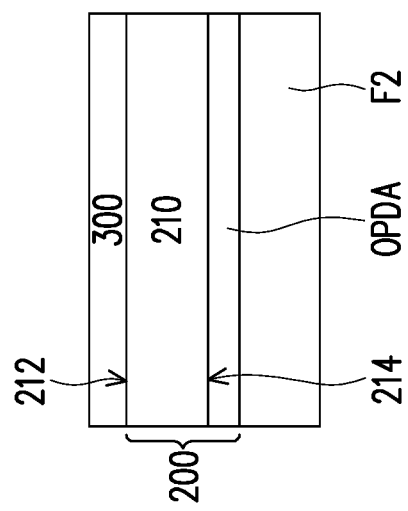

Referring to FIG. 7G, an optical glue 300 on the third side 212 of the second substrate 210.

Figure 7H:
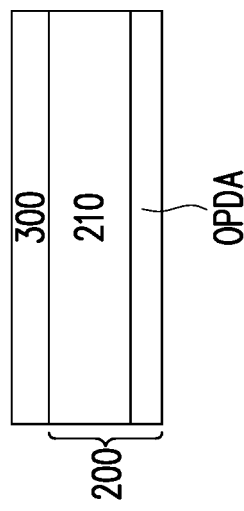

Referring to FIG. 7H, the protective film F2 on the photosensitive element substrate 200 is removed.

Figure 7I:
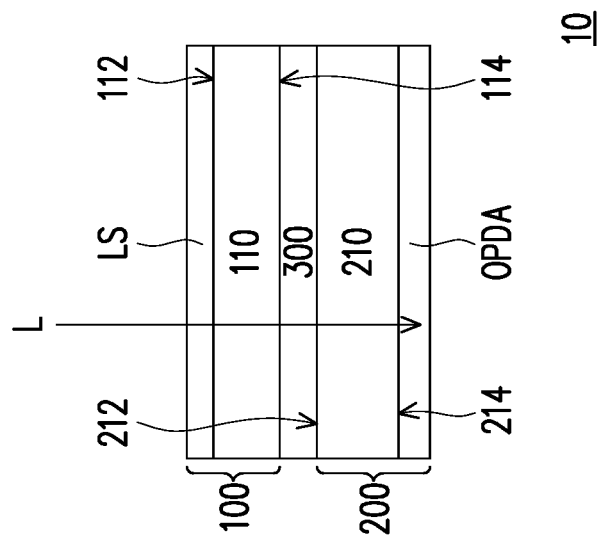

Referring to FIG. 7C, FIG. 7H, and FIG. 7I, the microlens substrate 100 is attached to the optical glue 300, and the protective film F1 on the microlens substrate 100 is removed. The optical glue 300 is located between the microlens substrate 100 and the photosensitive element substrate 200. The second side 114 of the first substrate 110 of the microlens substrate 100 faces the third side 212 of the second substrate 210 of the photosensitive element substrate 200.

By now, the photosensitive device 10 is substantially completed. In the embodiment, the light L sequentially passes through the optical structure layer LS, the first substrate 110, the optical glue 300, and the second substrate 210, and is then received by the photosensitive element array layer OPDA.

Based on the above description, the microlens substrate 100 and the photosensitive element substrate 200 are manufactured separately, and are then attached to each other through the optical glue 300. Therefore, even if the manufacturing process of the microlens substrate 100 includes high-temperature processing and organic solution processing, the organic photosensitive material layer OPL (referring to FIG. 6A) in the photosensitive element substrate 200 is not damaged due to the aforementioned high-temperature processing or organic solution processing, thereby increasing a manufacturing yield of the photosensitive device 10.

FIG. 8A to FIG. 8C are schematic cross-sectional views of a method for manufacturing a photosensitive device according to an embodiment of the disclosure.

Referring to FIG. 7A to FIG. 7F for the steps before FIG. 8A, which are not repeated.

Referring to FIG. 7F and FIG. 8A, after the photosensitive element substrate 200 and the protective film F2 are lifted up from the second carrier C2, a transparent adhesive film TG is attached to the second substrate 210. An adhesive surface TG1 of the transparent adhesive film TG faces the third side 212 of the second substrate 210. The optical glue 300 is formed on a non-adhesive surface TG2 of the transparent adhesive film TG.

Referring to FIG. 8B, the protective film F2 on the photosensitive element substrate 200 is removed.

Referring to FIG. 7C, FIG. 8B and FIG. 8C, the microlens substrate 100 is attached to the optical glue 300, and the protective film F1 on the microlens substrate 100 is removed.

By now, the photosensitive device 20 is substantially completed. A difference between the photosensitive device 20 of FIG. 8C and the photosensitive device 10 of FIG. 7I is that the photosensitive device 20 includes the transparent adhesive film TG, and the transparent adhesive film TG may be used to adjust a distance between the microlens substrate 100 and the photosensitive element substrate 200 and an overall thickness of the photosensitive device 20.

In the embodiment, the light L sequentially passes through the optical structure layer LS, the first substrate 110, the optical glue 300, the transparent adhesive film TG, and the second substrate 210, and is then received by the photosensitive element array layer OPDA.

Based on the above description, the microlens substrate 100 and the photosensitive element substrate 200 are manufactured separately, and are then attached to each other through the optical glue 300. Therefore, even if the manufacturing process of the microlens substrate 100 includes high-temperature processing and organic solution processing, the organic photosensitive material layer OPL (referring to FIG. 6A) in the photosensitive element substrate 200 is not damaged due to the aforementioned high-temperature processing or organic solution processing, thereby increasing a manufacturing yield of the photosensitive device 20.

Figure 9A:
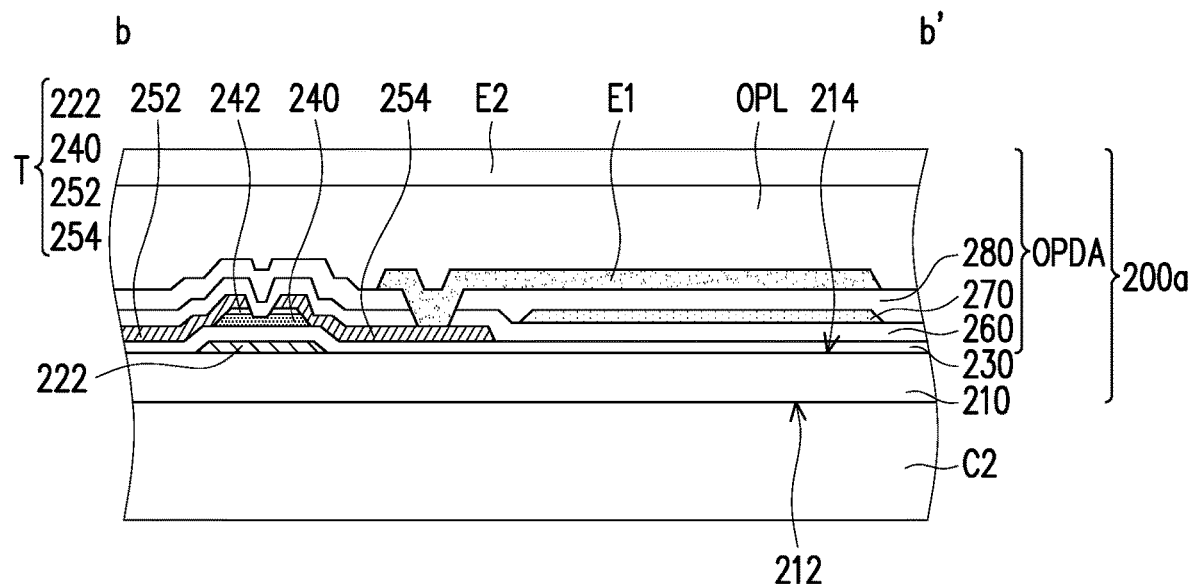
FIG. 9A is a schematic cross-sectional view of a photosensitive element substrate according to an embodiment of the disclosure.
Figure 9B:
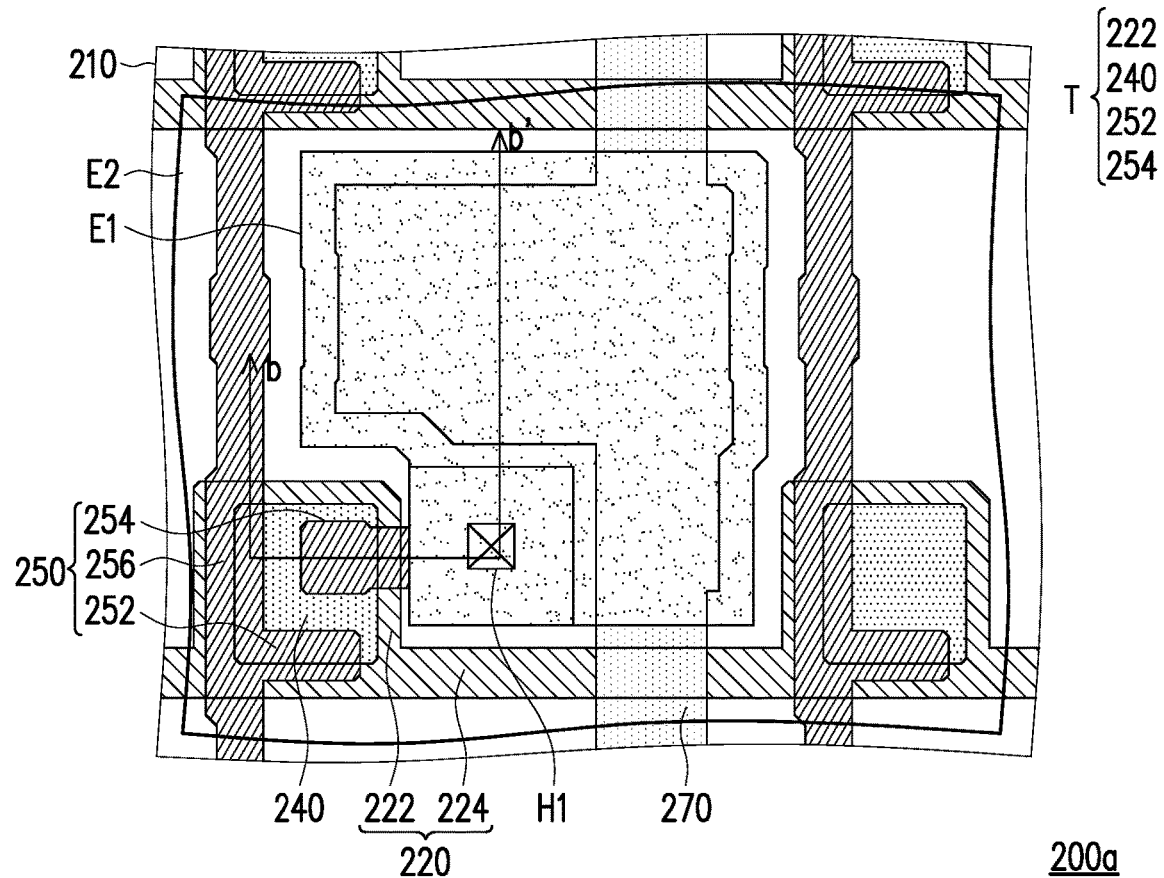
FIG. 9B is a schematic top view of the photosensitive element substrate of FIG. 9A.

FIG. 9A is a schematic cross-sectional view of a photosensitive element substrate according to an embodiment of the disclosure. FIG. 9B is a schematic top view of the photosensitive element substrate of FIG. 9A. FIG. 9A corresponds to a position of a line b-b' in FIG. 9B. It should be noticed that reference numbers of the components and a part of contents of the embodiment of FIG. 2A to FIG. 6B are also used in the embodiment of FIG. 9A and FIG. 9B, where the same reference numbers denote the same or like components, and descriptions of the same technical contents are omitted. The aforementioned embodiment may be referred for descriptions of the omitted parts, and detailed descriptions thereof are not repeated in the following embodiment.

A difference between the photosensitive element substrate 200a of FIG. 9A and FIG. 9B and the photosensitive element substrate 200 of FIG. 6A and FIG. 6B is that the buffer layer BP is not formed between the organic photosensitive material layer OPL and the first electrode E1 of the photosensitive element substrate 200a.

Referring to FIG. 9A and FIG. 9B, in the embodiment, the organic photosensitive material layer OPL is directly formed on the first electrode E1, and the organic photosensitive material layer OPL covers a top surface and a side surface of the first electrode E1. In the embodiment, the organic photosensitive material layer OPL covers the entire top surface of the first electrode E1, thereby increasing an area of the photosensitive region of the photosensitive element substrate 200a. In the embodiment, the area of the photosensitive region of the photosensitive element substrate 200a is substantially equal to the area of the top surface of the first electrode E1. If the area encircled by the scan lines 224 and the data lines 256 is taken as a pixel area, the area of the photosensitive region approximately occupies 24%-60% of the pixel area. In some embodiments, the pixel area of the photosensitive element substrate 200a is about 50 μm×50 μm or less than 50 μm×50 μm. In some embodiments, a resolution of the photosensitive element substrate 200a is greater than or equal to 500 ppi.

The method of bonding the photosensitive element substrate 200a and the microlens substrate 100 may refer to FIG. 7A to FIG. 7I and FIG. 8A to FIG. 8C, and detail thereof is not repeated.

FIG. 10A to FIG. 13A are schematic cross-sectional views of a method for manufacturing a photosensitive element substrate according to an embodiment of the disclosure. FIG. 10B to FIG. 13B are schematic top views of the method for manufacturing the photosensitive element substrate according to an embodiment of the disclosure. FIG. 10A to FIG. 13A respectively correspond to positions of lines c-c' in FIG. 10B to FIG. 13B.

Figure 10A:
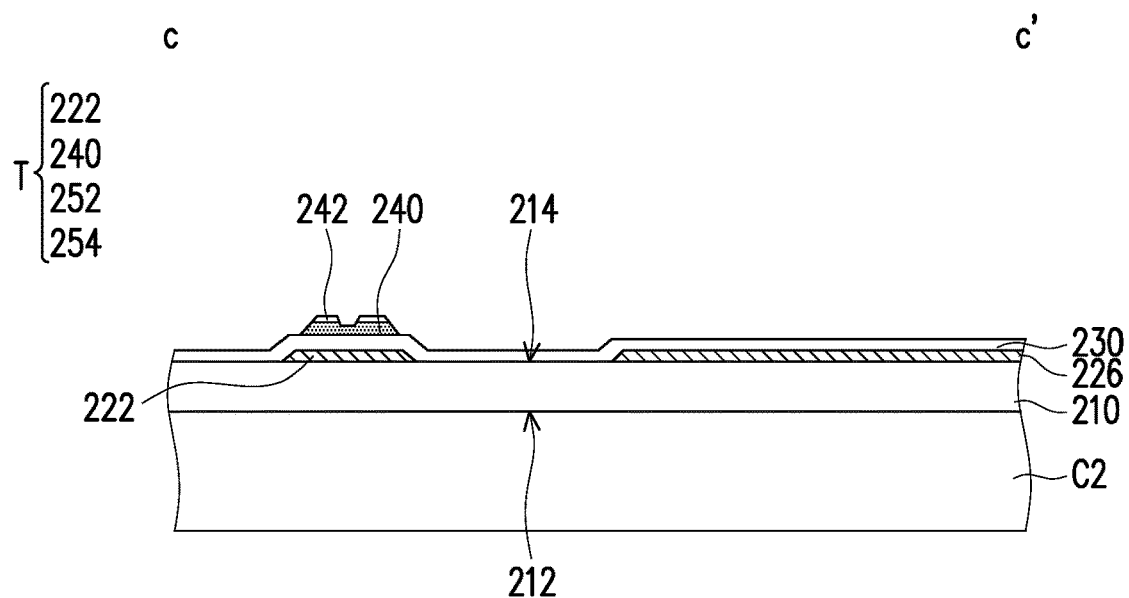
Figure 10B:
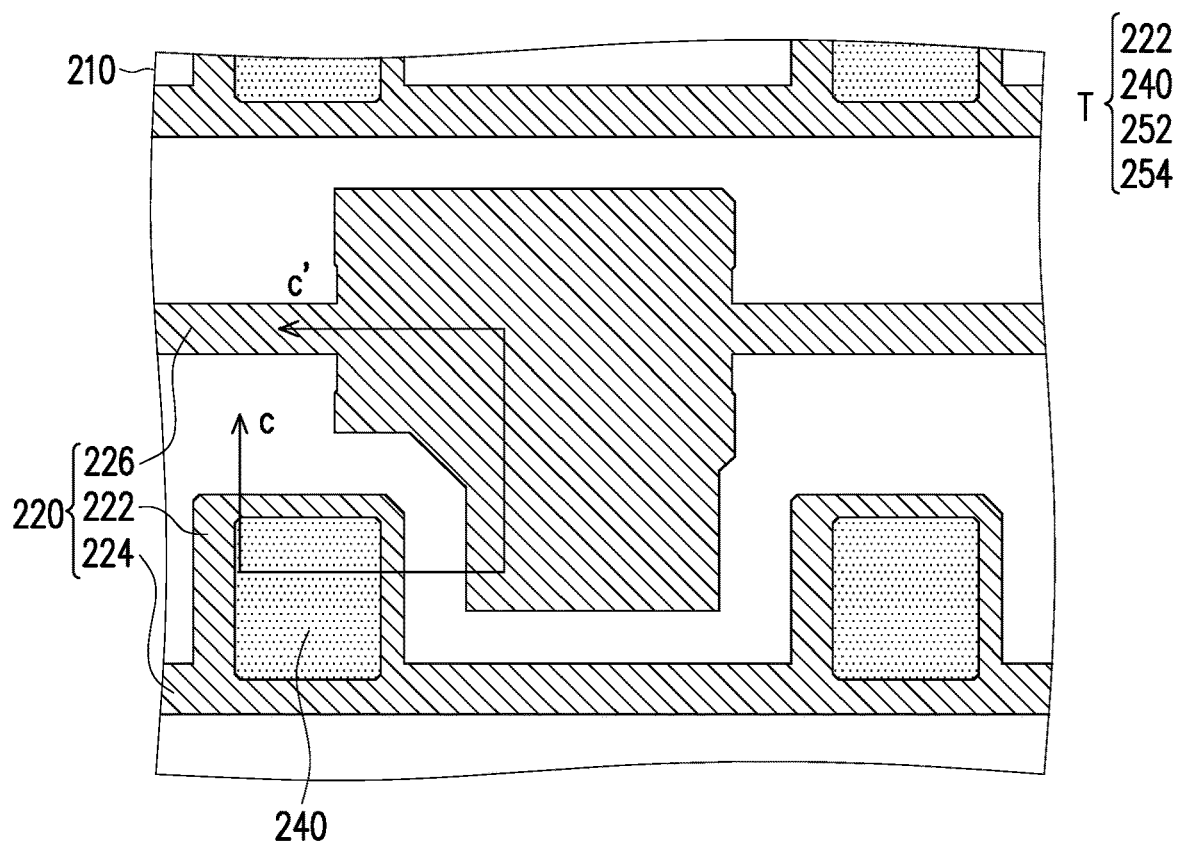

Referring to FIG. 10A and FIG. 10B, a second substrate 210 is formed on a second carrier C2. A material of the second carrier C2 is, for example, glass, quartz, metal or other materials suitable for carrying the photosensitive element substrate.

The second substrate 210 has a third side 212 and a fourth side 214 opposite to the third side 212. The third side 212 of the second substrate 210 faces the second carrier C2 and is in contact with the second carrier C2. In some embodiments, the second substrate 210 is made of a flexible material, for example, including polyamide (PA), polyimide (PI), poly (methyl methacrylate) (PMMA), polyethylene naphthalate (PEN), polyethylene terephthalate (PET), fiber reinforced plastics (FRP), polyetheretherketone (PEEK), epoxy resin or other suitable materials or a combination of at least two of the above materials, but the disclosure is not limited thereto.

A first conductive layer 220, a gate insulating layer 230, and a semiconductor layer 240 are formed on the fourth side 214 of the second substrate 210. The first conductive layer 220 includes a gate 222, a scan line 224 connected to the gate 222 and a common electrode 226. The gate 222 and the scan line 224 are located on the fourth side 214 of the second substrate 210. In some embodiments, a method of forming the first conductive layer 220 includes forming a conductive material on the fourth side 214 of the second substrate 210, and then patterning the conductive material to form the gate 222, the scan line 224 and the common electrode 226. A material of the first conductive layer 220 is, for example, a metal, a nitride, an oxide, an oxynitride, or other suitable materials or a stacked layer of a metal material and other conductive materials.

The gate insulating layer 230 is formed on the first conductive layer 220. A material of the gate insulating layer 230 is, for example, nitride, oxide, oxynitride, an organic material or other suitable insulating materials.

The semiconductor layer 240 is formed on the gate insulating layer 230. The semiconductor layer 240 is overlapped with the gate 222, and the gate insulating layer 230 is sandwiched between the semiconductor layer 240 and the gate 222. The semiconductor layer 240 includes amorphous silicon, polycrystal silicon, microcrystal silicon, single crystal silicon, an organic semiconductor material, an oxide semiconductor material (for example: indium zinc oxide, indium gallium zinc oxide or other suitable materials, or a combination thereof) or other suitable materials or a combination of the above materials. In some embodiments, an ohmic contact layer 242 is formed on a surface of the semiconductor layer 240 (not shown in FIG. 2B), and a material of the ohmic contact layer 242 is, for example, a doped semiconductor material.

Figure 11A:
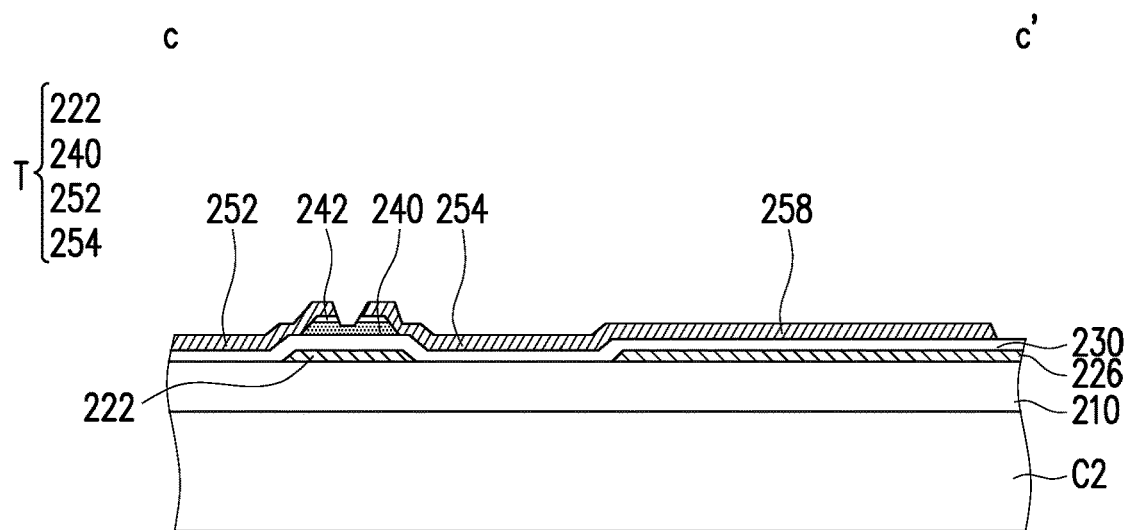
Figure 11B:
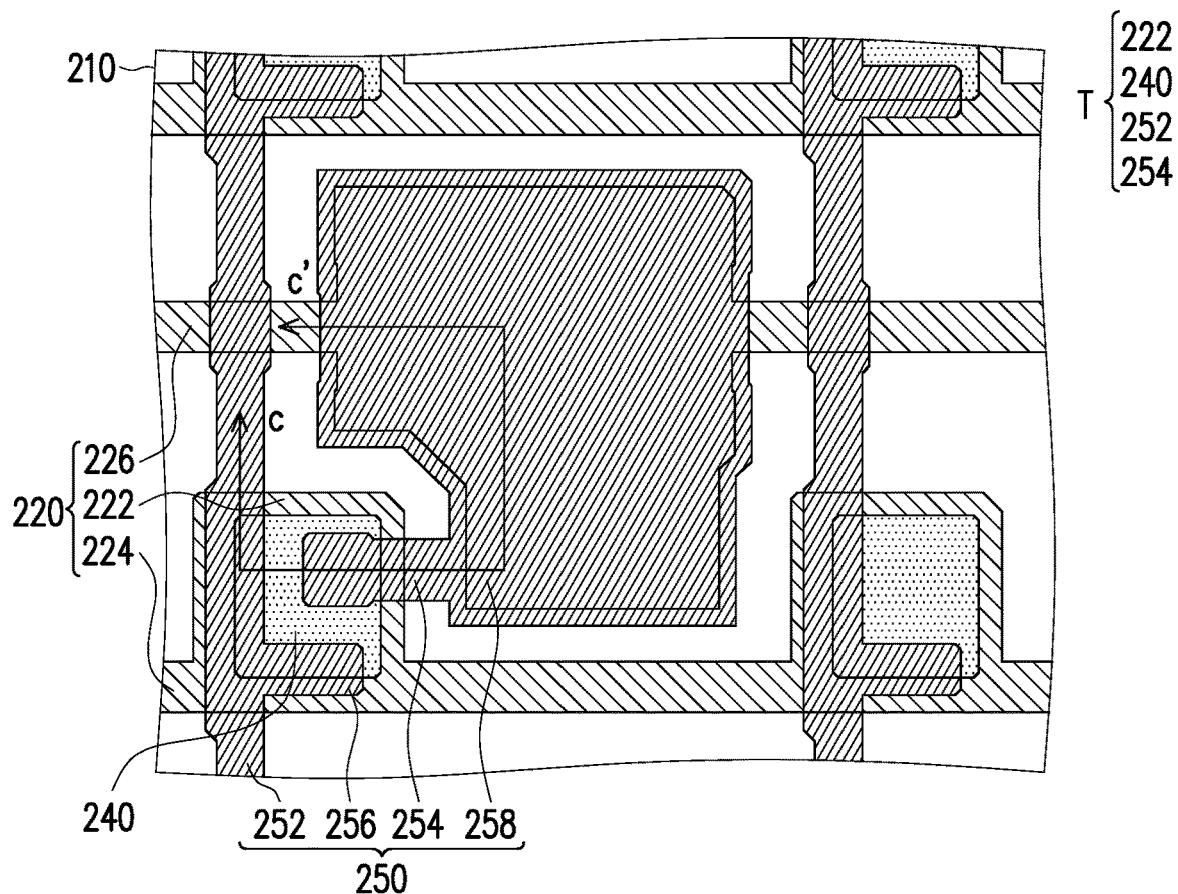
Figure 12A:
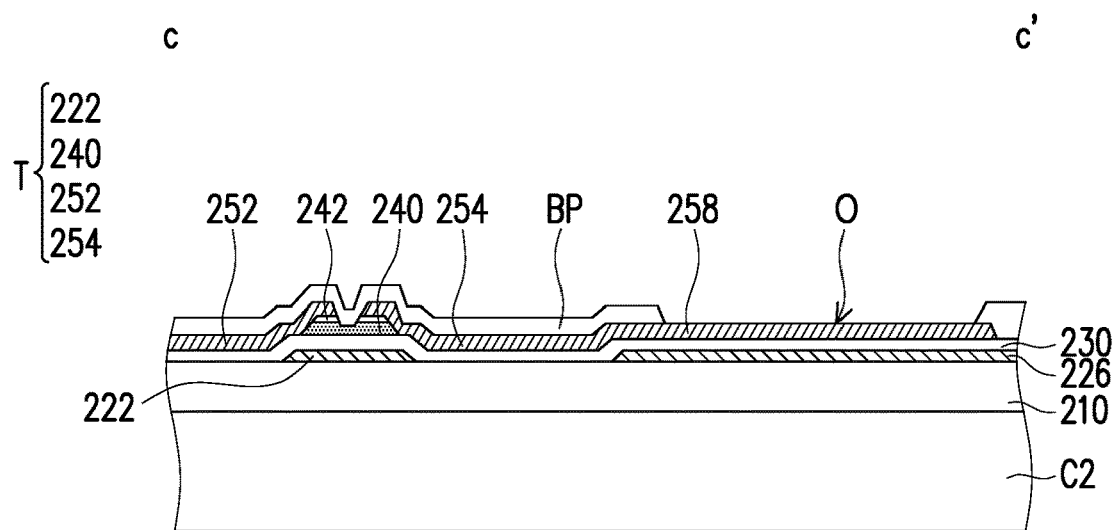
Figure 12B:
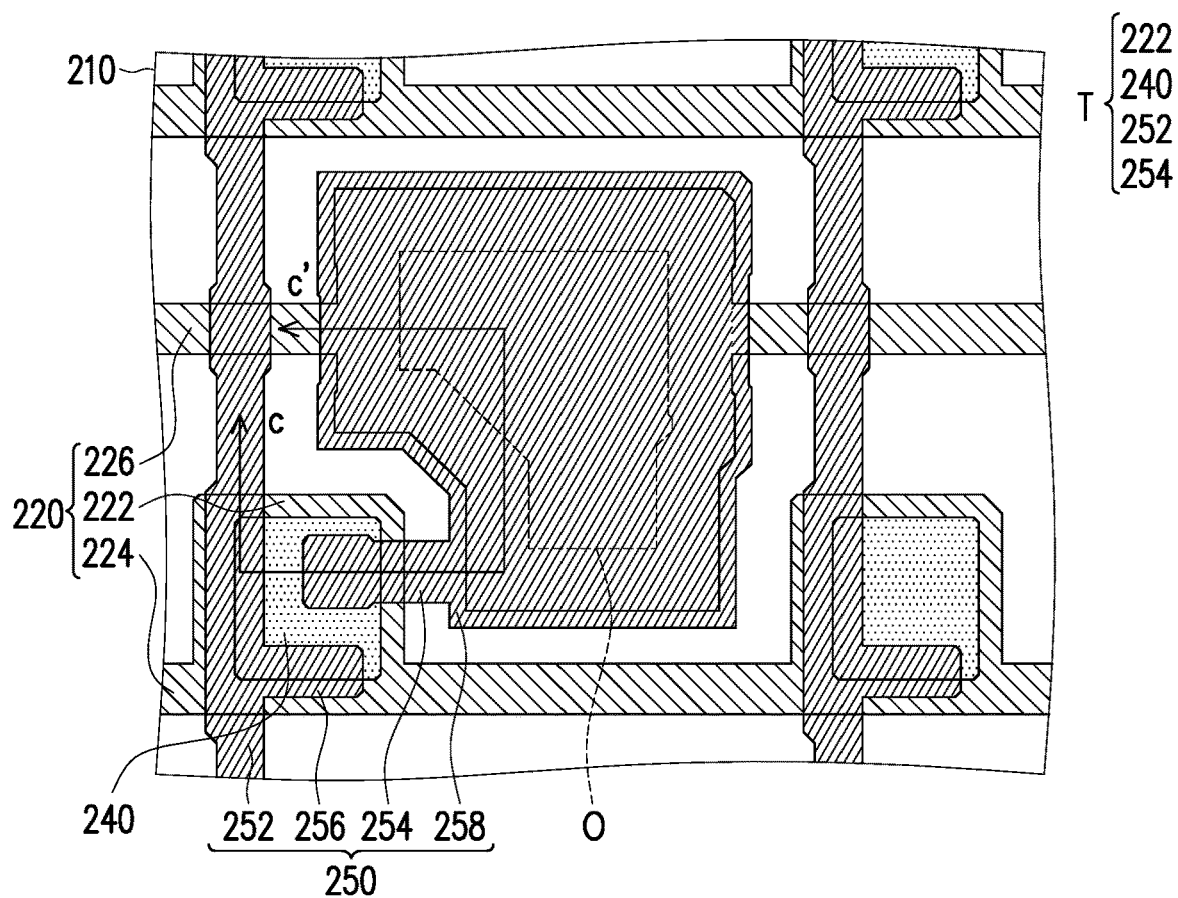

Referring to FIG. 11A and FIG. 11B, a second conductive layer 250 is formed on the semiconductor layer 240 and the gate insulating layer 230. The second conductive layer 250 includes a source 252, a drain 254, a data line 256 and a first electrode 258, where the source 252 and the drain 254 are electrically connected to the semiconductor layer 240, and the data line 256 is connected to the source 252, and the first electrode 258 is connected to the drain 254.

The common electrode 226 is closer to the second substrate 210 compared with the first electrode 258, and each common electrode 226 is overlapped with a plurality of first electrodes 258 (the common electrode 226 extends to a region that is not shown in FIG. 11B and is overlapped with the other first electrodes that are not shown). In some embodiments, a method of forming the second conductive layer 250 includes forming a conductive material on the semiconductor layer 240 and the gate insulating layer 230, and then patterning the conductive material to form the source 252, the drain 254, the data line 256 and the first electrode 258, where when the aforementioned conductive material is patterned, a part of the ohmic contact layer 242 between the source 252 and the drain 254 may be removed. A material of the second conductive layer 250 is, for example, a metal, a nitride, an oxide, an oxynitride, or other suitable materials, or a stacked layer of a metal material and other conductive materials.

By now, a plurality of active components T are substantially completed. The active component T is located on the fourth side 214 of the second substrate 210 and includes the gate 222, the semiconductor layer 240, the source 252 and the drain 254. The plurality of first electrodes E1 are respectively electrically connected to the drains 254 of the plurality of active components T. In some embodiments, the first electrode E1 includes a metal material, and each drain electrode 254 and the corresponding first electrode E1 are formed integrally. In the embodiment, the active component T is a bottom gate type thin-film transistor, but the disclosure is not limited thereto. In other embodiments, the active component T may also be a top gate type or other types of thin-film transistor.

A buffer layer BP is formed on the active component T, the first electrode 256 and the gate insulating layer 230. The buffer layer BP has a plurality of openings O. The openings O are respectively overlapped with the first electrodes E1. In the embodiment, each opening O is overlapped with one first electrode E1. A material of the buffer layer BP includes an organic material, an oxide, a nitride, an oxynitride or other insulating materials.

Figure 13A:
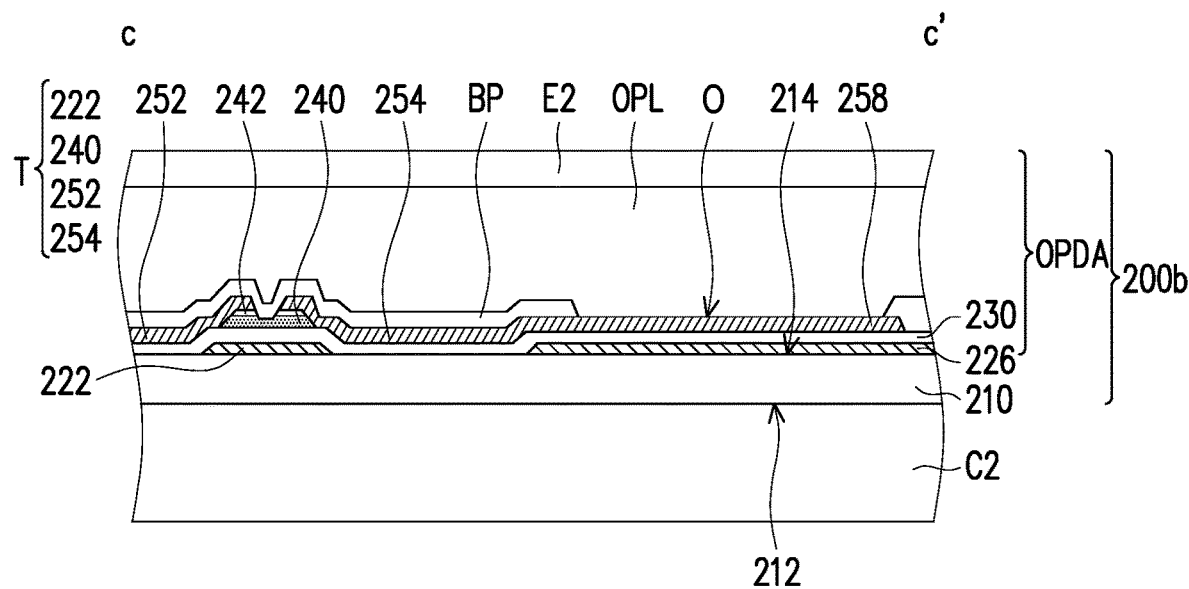
Figure 13B:
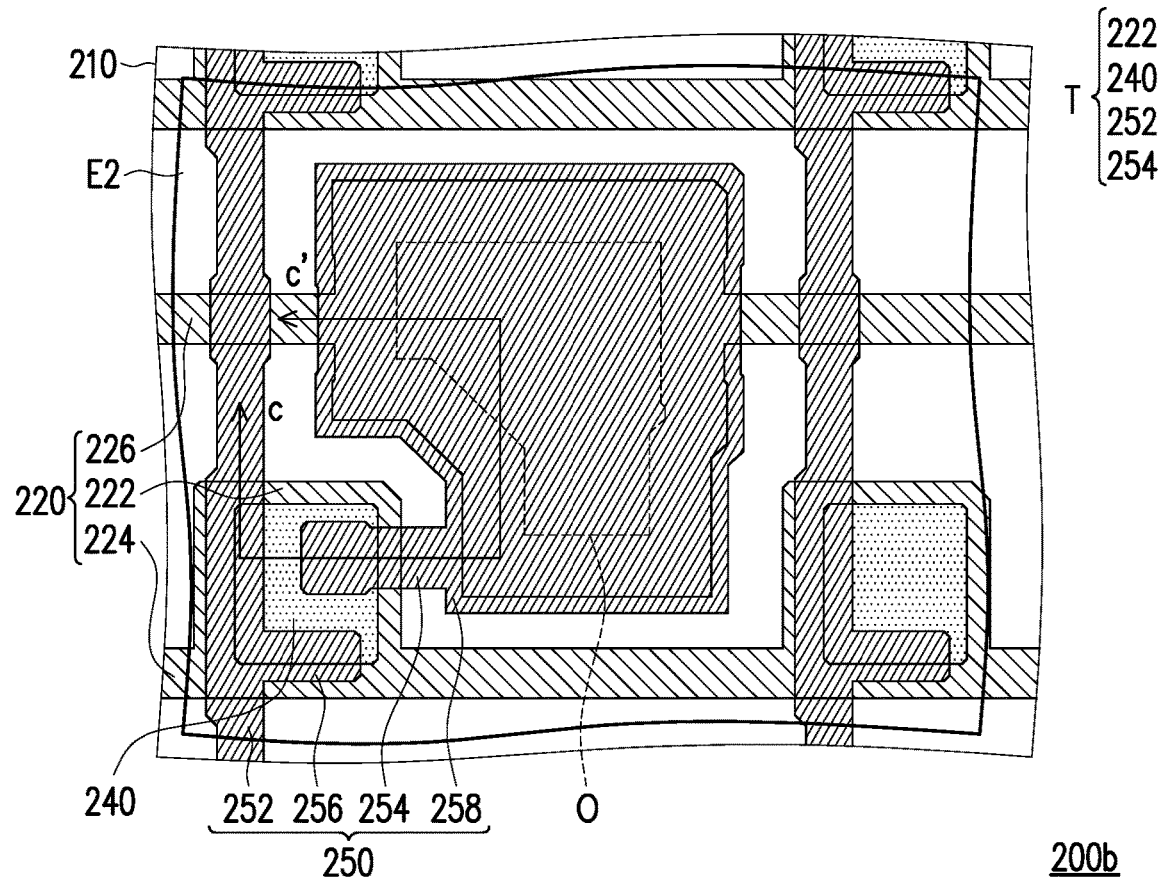

Referring to FIG. 13A and FIG. 13B, an organic photosensitive material layer OPL is formed on the first electrodes E1 and the buffer layer BP. In the embodiment, the organic photosensitive material layer OPL is filled in the openings O and contacts the first electrodes E1. In some embodiments, the organic photosensitive material layer OPL is entirely formed on the first electrodes E1 and the buffer layer BP. The organic photosensitive material layer OPL is overlapped with a plurality of the first electrodes E1, and the organic photosensitive material layers OPL on the adjacent first electrodes E1 are laterally connected to each other.

A second electrode E2 is formed on the organic photosensitive material layer OPL. In some embodiments, the second electrode E2 is entirely formed on the organic photosensitive material layer OPL. The second electrode E2 is overlapped with the plurality of first electrodes E1, and the second electrodes E2 on the adjacent first electrodes E1 are laterally connected to each other. The organic photosensitive material layer OPL is located between the first electrodes E1 and the second electrode E2. In some embodiments, the first electrodes E1 are closer to the fourth side 214 of the second substrate 210 compared with the second electrode E2.

In some embodiments, the second electrode E2 includes a polymer nanoparticle material or a nanometal material (such as silver nanoparticle or silver nanowire). In some embodiments, the second electrode E2 is made of a transparent conductive material, and a transmittance of the second electrode E2 in a visible light band (400-700 nm) is greater than 90%. In some embodiments, light enters the organic photosensitive material layer OPL from one side of the second electrode E2, and generates electron hole pairs in the organic photosensitive material layer OPL.

By now, fabrication of the photosensitive element substrate 200b is substantially completed. In the embodiment, the photosensitive element substrate 200b includes the second substrate 210 and a photosensitive element array layer OPDA on the second substrate 210. The photosensitive element array layer OPDA includes a plurality of the active components T, a plurality of the first electrodes E1, the second electrode E2, and the organic photosensitive material layer OPL. In the embodiment, the photosensitive element array layer OPDA further includes the scan line 224, the common electrode 226, the gate insulating layer 230, the data line 256, and the buffer layer BP.

In the embodiment, an area of a photosensitive region of the photosensitive element substrate 200b is approximately equal to an area of the opening O. If an area encircled by the scan lines 224 and the data lines 256 is taken as a pixel area, the area of the photosensitive region approximately occupies 24%-85% of the pixel area. In some embodiments, the pixel area of the photosensitive element substrate 200b is about 50 μm×50 μm or less than 50 μm×50 μm. In some embodiments, a resolution of the photosensitive element substrate 200b is greater than or equal to 500 ppi.

Figure 14C:
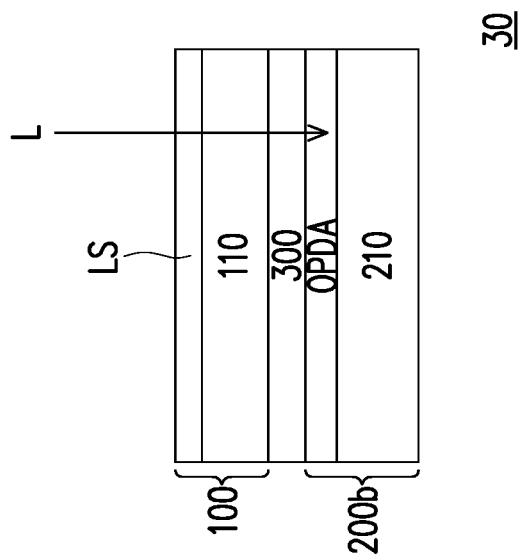
FIG. 14A to FIG. 14C are schematic cross-sectional views of a method for manufacturing a photosensitive device according to an embodiment of the disclosure.
Figure 14B:
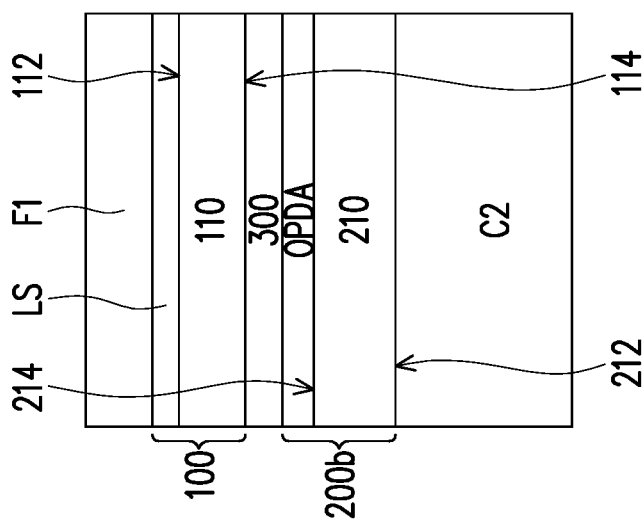
Figure 14A:
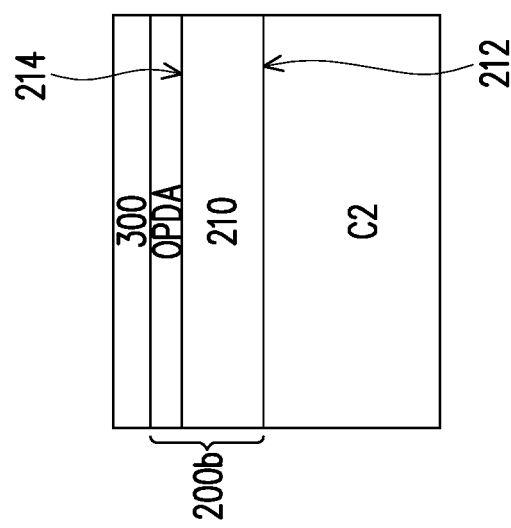

FIG. 14A to FIG. 14C are schematic cross-sectional views of a method for manufacturing a photosensitive device according to an embodiment of the disclosure.

Referring to FIG. 14A, a photosensitive element substrate 200b is formed on the second carrier C2. The photosensitive element substrate 200b includes a second substrate 110 and a photosensitive element array layer OPDA. Reference may be made to FIG. 13A and FIG. 13B and related description thereof for the structure of the photosensitive element array layer OPDA, and detail thereof is not repeated.

An optical glue 300 is formed on the photosensitive element substrate 200b. In the embodiment, the optical glue 300 is formed on the photosensitive element array layer OPDA.

Referring to FIG. 7C and FIG. 14B, the microlens substrate 100 and the protective film F1 are attached to the optical glue 300. The optical glue 300 is located between the microlens substrate 100 and the photosensitive element substrate 200b. The second side 114 of the first substrate 110 of the microlens substrate 100 faces the fourth side 214 of the second substrate 210 of the photosensitive element substrate 200b.

Referring to FIG. 14C, the protective film F1 on the microlens substrate 100 is removed, and the microlens substrate 100, the optical glue 300, and the photosensitive element substrate 200b are lifted up from the second carrier C2.

By now, fabrication of the photosensitive device 30 is substantially completed. In the embodiment, the light L sequentially passes through the optical structure layer LS, the first substrate 110 and the optical glue 300, and is then received by the photosensitive element array layer OPDA.

Based on the above description, the microlens substrate 100 and the photosensitive element substrate 200b are manufactured separately, and are then attached to each other through the optical glue 300. Therefore, even if the manufacturing process of the microlens substrate 100 includes high-temperature processing and organic solution processing, the organic photosensitive material layer OPL (referring to FIG. 13A) in the photosensitive element substrate 200b is not damaged due to the aforementioned high-temperature processing or organic solution processing, thereby increasing a manufacturing yield of the photosensitive device 30.

FIG. 15A to 15C are schematic cross-sectional views of a method for manufacturing a photosensitive device according to an embodiment of the disclosure.

Referring to FIG. 15A, the photosensitive element substrate 200b is formed on the second carrier C2. The photosensitive element substrate 200b includes the second substrate 110 and the photosensitive element array layer OPDA. Reference may be made to FIG. 13A, FIG. 13B and related descriptions thereof for the structure of the photosensitive element array layer OPDA, and detail thereof is not repeated.

A transparent adhesive film TG is attached to the photosensitive element array layer OPDA. An adhesive surface TG1 of the transparent adhesive film TG faces the fourth side 214 of the second substrate 210.

Referring to FIG. 15B, the transparent adhesive film TG and the photosensitive element substrate 200b are lifted up from the second carrier C2, and the optical glue 300 is formed on a non-adhesive surface TG2 of the transparent adhesive film TG.

Referring to FIG. 7C, FIG. 15B and FIG. 15C, the microlens substrate 100 is attached to the optical glue 300, and the protective film F2 on the photosensitive element substrate 200 is removed.

By now, the photosensitive device 40 is substantially completed. A difference between the photosensitive device 40 of FIG. 15C and the photosensitive device 30 of FIG. 13C is that the photosensitive device 40 includes the transparent adhesive film TG, and the transparent adhesive film TG may be used to adjust a distance between the microlens substrate 100 and the photosensitive element substrate 200 and an overall thickness of the photosensitive device 40.

In the embodiment, the light L sequentially passes through the optical structure layer LS, the first substrate 110, the optical glue 300, and the transparent adhesive film TG, and is then received by the photosensitive element array layer OPDA.

Based on the above description, the microlens substrate 100 and the photosensitive element substrate 200b are manufactured separately, and are then attached to each other through the optical glue 300. Therefore, even if the manufacturing process of the microlens substrate 100 includes high-temperature processing and organic solution processing, the organic photosensitive material layer OPL (referring to FIG. 13A) in the photosensitive element substrate 200b is not damaged due to the aforementioned high-temperature processing or organic solution processing, thereby increasing a manufacturing yield of the photosensitive device 40.

Figure 16A:
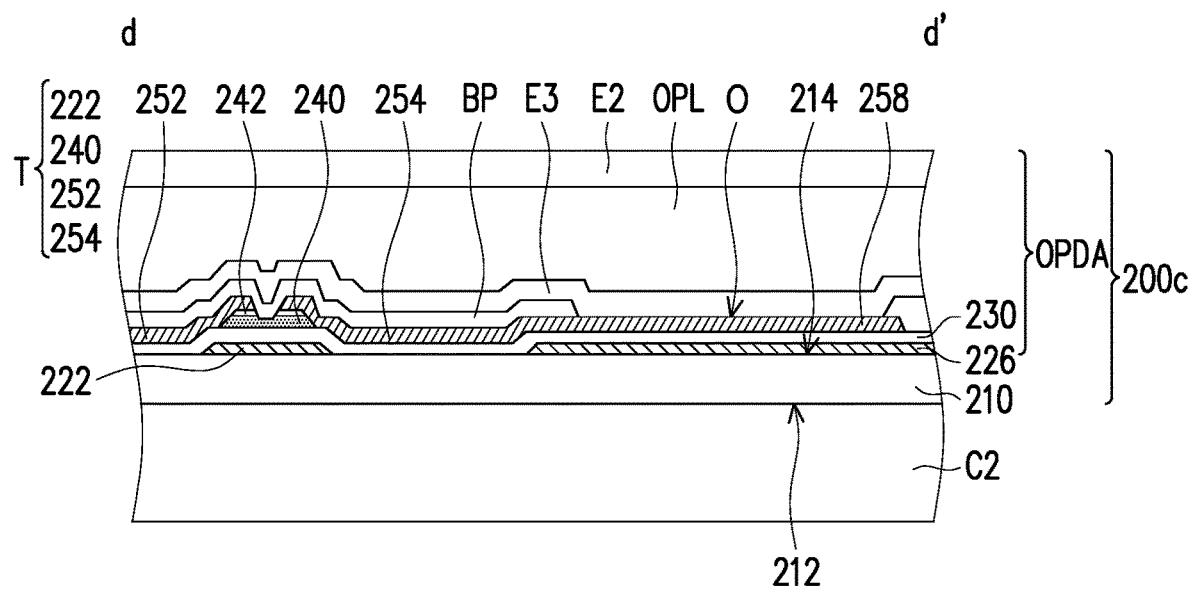
FIG. 16A is a schematic cross-sectional view of a photosensitive element substrate according to an embodiment of the disclosure.
Figure 16B:
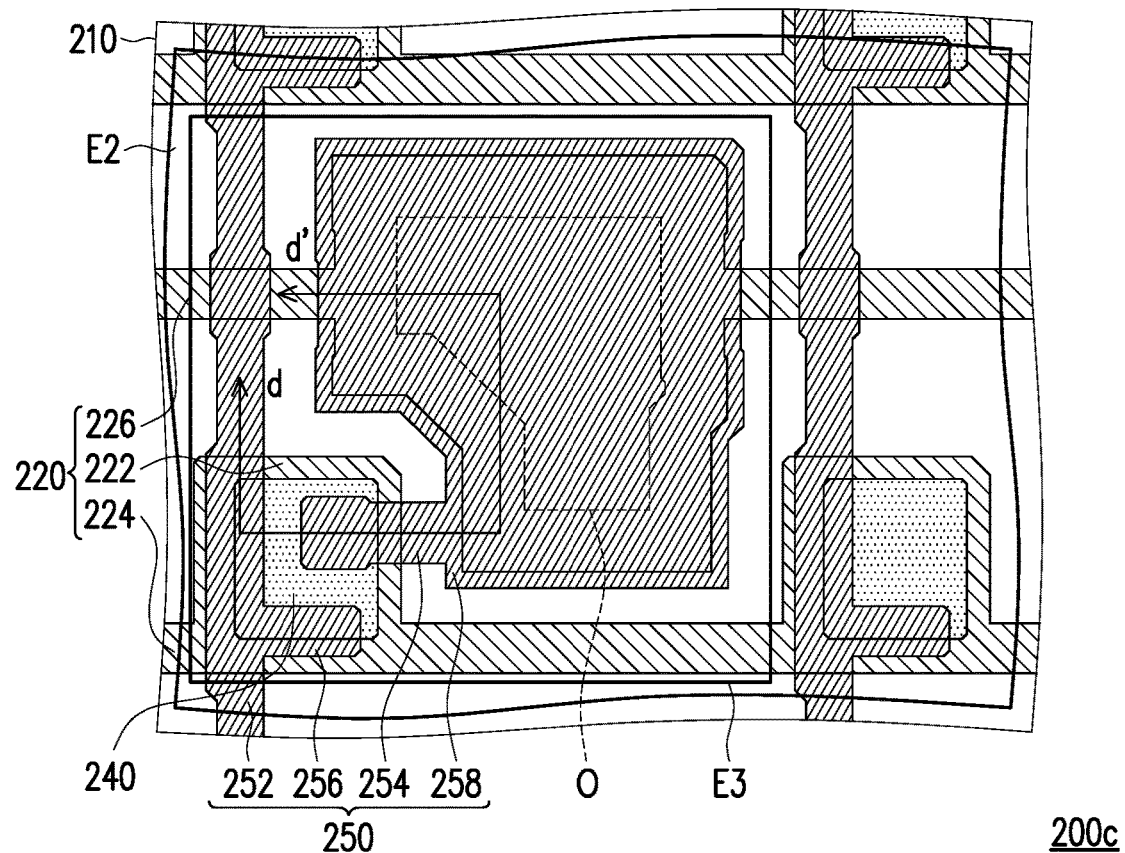
FIG. 16B is a schematic top view of the photosensitive element substrate of FIG. 16A.

FIG. 16A is a schematic cross-sectional view of a photosensitive element substrate according to an embodiment of the disclosure. FIG. 16B is a schematic top view of the photosensitive element substrate of FIG. 16A. FIG. 16A corresponds to a position of a line d-d' in FIG. 16B. It should be noticed that reference numbers of the components and a part of contents of the embodiment of FIG. 10A to FIG. 13B are also used in the embodiment of FIG. 16A and FIG. 16B, where the same reference numbers denote the same or like components, and descriptions of the same technical contents are omitted. The aforementioned embodiment may be referred for descriptions of the omitted parts, and detailed descriptions thereof are not repeated in the following embodiment.

A difference between the photosensitive element substrate 200c of FIG. 16A and FIG. 16B and the photosensitive element substrate 200b of FIG. 13A and FIG. 13B is that the photosensitive element substrate 200c further includes third electrodes E3.

Referring to FIG. 16A and FIG. 16B, in the embodiment, a plurality of the third electrodes E3 are respectively filled into the openings O of the buffer layer BP, and are electrically connected to the first electrodes E1. An area of each third electrode E3 is larger than the area of the corresponding opening O, and the third electrode E3 is overlapped with the corresponding source 252, the corresponding semiconductor layer 240, and the corresponding gate 222. The third electrode E3 is made of a transparent conductive material. For example, the third electrode E3 is made of a metal oxide (for example, indium tin oxide or indium zinc oxide).

The organic photosensitive material layer OPL is directly formed on the third electrode E3, and the organic photosensitive material layer OPL covers a top surface and a side surface of the third electrode E3. In the embodiment, the organic photosensitive material layer OPL covers the entire top surface of the third electrode E3, thereby increasing an area of a photosensitive region of the photosensitive element substrate 200c. In the embodiment, the area of the photosensitive region of the photosensitive element substrate 200c is approximately equal to an area of the top surface of the third electrode E3. If an area encircled by the scan lines 224 and the data lines 256 is taken as a pixel area, the area of the photosensitive region approximately occupies 24%-85% of the pixel area. In some embodiments, the pixel area of the photosensitive element substrate 200c is about 50 μm×50 μm or less than 50 μm×50 μm. In some embodiments, a resolution of the photosensitive element substrate 200c is greater than or equal to 500 ppi.

The method of bonding the photosensitive element substrate 200c and the microlens substrate 100 may refer to FIG. 13A to FIG. 13C and FIG. 14A to FIG. 14C, and detail thereof is not repeated.

Figure 17:
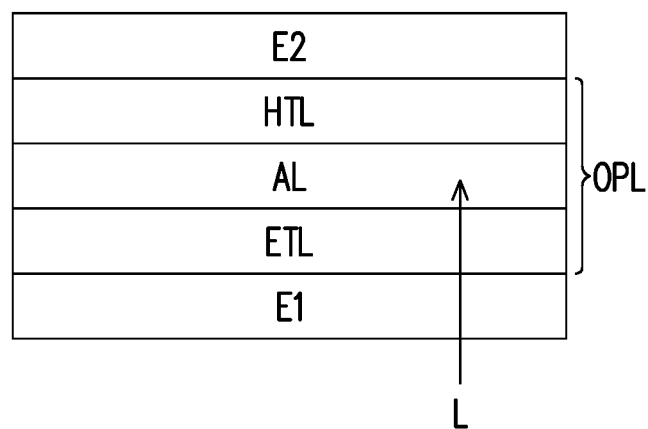
FIG. 17 is a schematic cross-sectional view of a first electrode, an organic photosensitive material layer, and a second electrode according to an embodiment of the disclosure.

FIG. 17 is a schematic cross-sectional view of a first electrode, an organic photosensitive material layer, and a second electrode according to an embodiment of the disclosure.

Referring to FIG. 17, in the embodiment, the organic photosensitive material layer OPL includes an electron transport layer ETL, an active layer AL, and a hole transport layer HTL that are sequentially stacked.

The electron transport layer ETL is located between the active layer AL and the first electrode E1. The hole transport layer HTL is located between the active layer AL and the second electrode E2.

In some embodiment, the light L enters the organic photosensitive material layer OPL from the side of the first electrode E1. In other words, the light L first reaches the electron transport layer ETL, and then enter the active layer AL and the hole transport layer HTL. In some embodiments, a photoelectric conversion efficiency of the light L at the electron transport layer ETL is better than a photoelectric conversion efficiency of the light L at the hole transport layer HTL. Therefore, to design the light L to enter the organic photosensitive material layer OPL from the side of the first electrode E1, the photosensitive element substrate may have better photoelectric conversion efficiency. For example, in the photosensitive element substrate 200 of FIG. 9A and the photosensitive element substrate 200a of FIG. 6B, the light L enters the organic photosensitive material layer OPL from the side of the first electrode E1, so that the photosensitive element substrates have better photoelectric conversion efficiency.

In summary, the microlens substrate and the photosensitive element substrate are manufactured separately, and are then attached to each other through the optical glue. Therefore, even if the manufacturing process of the microlens substrate includes the high-temperature processing or the organic solution processing, the organic photosensitive material layer in the photosensitive element substrate is not damaged due to the aforementioned high-temperature processing or the organic solution processing, thereby increasing the manufacturing yield of the photosensitive device.

What is claimed is:

1. A photosensitive device, comprising:
 a microlens substrate, comprising:
  a first substrate, comprising a first side and a second side opposite to the first side; and
  a plurality of microlenses, located on the first side of the first substrate;
 a photosensitive element substrate, comprising:
  a second substrate, comprising a third side and a fourth side opposite to the third side, wherein the second side of the first substrate faces the fourth side of the second substrate;
  a plurality of active components, located on the fourth side of the second substrate;
  a plurality of first electrodes, respectively electrically connected to the active components, wherein each of the active components comprises:
   a gate, located on the fourth side of the second substrate;
   a semiconductor layer, overlapped with the gate, wherein a gate insulating layer is sandwiched between the semiconductor layer and the gate; and
   a source and a drain, electrically connected to the semiconductor layer, and the drain being electrically connected to a corresponding first electrode of the first electrodes, wherein the first electrodes comprise a metal material, and each drain and the corresponding first electrode are formed integrally;
  a second electrode, overlapped with the first electrodes; and
  an organic photosensitive material layer, located between the first electrodes and the second electrode, wherein the first electrodes are closer to the fourth side of the second substrate compared with the second electrode; and
 an optical glue, located between the microlens substrate and the photosensitive element substrate.

2. The photosensitive device as claimed in claim 1, further comprising:
 a buffer layer, covering the first electrodes, and comprising a plurality of openings, wherein the openings are respectively overlapped with the first electrodes; and
 a plurality of third electrodes, respectively filled in the openings, and electrically connected to the first electrodes.

3. The photosensitive device as claimed in claim 2, wherein the organic photosensitive material layer covers a top surface and a side surface of each of the third electrodes.

4. The photosensitive device as claimed in claim 2, wherein the third electrodes comprise a transparent conductive material, and an area of each of the third electrodes is larger than an area of a corresponding opening of the openings.

5. The photosensitive device as claimed in claim 4, wherein each of the third electrodes is overlapped with the corresponding source, the corresponding semiconductor layer, and the corresponding gate.

6. The photosensitive device as claimed in claim 1, wherein the second electrode comprises a polymer nanoparticle material or a metal material.

7. The photosensitive device as claimed in claim 1, wherein the organic photosensitive material layer comprises:
- an active layer;
- an electron transport layer, located between the active layer and the first electrodes; and
- a hole transport layer, located between the active layer and the second electrode.

8. The photosensitive device as claimed in claim 1, further comprising:
- a transparent adhesive film, wherein an adhesive surface of the transparent adhesive film faces the fourth side of the second substrate, and the optical glue is located on a non-adhesive surface of the transparent adhesive film.

9. The photosensitive device as claimed in claim 1, further comprising:
- a common electrode, overlapped with the first electrodes, wherein the common electrode is closer to the second substrate compared with the first electrodes.

10. A photosensitive device, comprising:
a microlens substrate, comprising:
- a first substrate, comprising a first side and a second side opposite to the first side; and
- a plurality of microlenses, located on the first side of the first substrate;

a photosensitive element substrate, comprising:
- a second substrate, comprising a third side and a fourth side opposite to the third side, wherein the second side of the first substrate faces the fourth side of the second substrate;
- a plurality of active components, located on the fourth side of the second substrate;
- a plurality of first electrodes, respectively electrically connected to the active components;
- a second electrode, overlapped with the first electrodes;
- an organic photosensitive material layer, located between the first electrodes and the second electrode, wherein the first electrodes are closer to the fourth side of the second substrate compared with the second electrode;
- a buffer layer, covering the first electrodes, and comprising a plurality of openings, wherein the openings are respectively overlapped with the first electrodes; and
- a plurality of third electrodes, respectively filled in the openings, and electrically connected to the first electrodes; and an optical glue, located between the microlens substrate and the photosensitive element substrate.

11. A photosensitive device, comprising:
a microlens substrate, comprising:
- a first substrate, comprising a first side and a second side opposite to the first side; and
- a plurality of microlenses, located on the first side of the first substrate;

a photosensitive element substrate, comprising:
- a second substrate, comprising a third side and a fourth side opposite to the third side, wherein the second side of the first substrate faces the fourth side of the second substrate;
- a plurality of active components, located on the fourth side of the second substrate;
- a plurality of first electrodes, respectively electrically connected to the active components;
- a second electrode, overlapped with the first electrodes;
- an organic photosensitive material layer, located between the first electrodes and the second electrode, wherein the first electrodes are closer to the fourth side of the second substrate compared with the second electrode; and
- a common electrode, overlapped with the first electrodes, wherein the common electrode is closer to the second substrate compared with the first electrodes; and an optical glue, located between the microlens substrate and the photosensitive element substrate.

* * * * *